United States Patent
Chen et al.

(10) Patent No.: US 9,583,615 B2
(45) Date of Patent: Feb. 28, 2017

(54) VERTICAL TRANSISTOR AND LOCAL INTERCONNECT STRUCTURE

(71) Applicant: SANDISK 3D LLC, Milpitas, CA (US)

(72) Inventors: Yung-Tin Chen, Santa Clara, CA (US); Guangle Zhou, Fremont, CA (US); Christopher Petti, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/623,843

(22) Filed: Feb. 17, 2015

(65) Prior Publication Data

US 2016/0240665 A1 Aug. 18, 2016

(51) Int. Cl.
*H01L 29/78* (2006.01)
*H01L 29/66* (2006.01)
(Continued)

(52) U.S. Cl.
CPC .. *H01L 29/7827* (2013.01); *H01L 21/823487* (2013.01); *H01L 21/84* (2013.01);
(Continued)

(58) Field of Classification Search
CPC ............. H01L 29/0603; H01L 29/0847; H01L 29/7827
(Continued)

(56) References Cited

U.S. PATENT DOCUMENTS

| 5,915,167 | A | 6/1999 | Leedy |
| 7,005,350 | B2 | 2/2006 | Walker et al. |

(Continued)

FOREIGN PATENT DOCUMENTS

| EP | 0 721 221 A2 | 7/1996 |
| KR | 20100109745 A | 10/2010 |

(Continued)

OTHER PUBLICATIONS

Invitation to Pay Additional Search Fees issued in PCT Application No. PCT/US15/62548, mailed Feb. 15, 2016 (8 pgs.).
(Continued)

*Primary Examiner* — Kenneth Parker
*Assistant Examiner* — Warren H Kilpatrick
(74) *Attorney, Agent, or Firm* — The Marbury Law Group PLLC

(57) ABSTRACT

A first patterned stack and a second patterned stack are formed over a substrate, each of which includes a bottom semiconductor layer, a bottom dielectric spacer layer, a conductive material layer, and a top dielectric spacer layer. Gate dielectrics and vertical semiconductor portions are sequentially formed on each patterned stack. Vertical semiconductor portions are removed from around the second patterned stack, while masked around the first patterned stack. Electrical dopants are introduced to top regions and bottom regions of the remaining vertical semiconductor portions to form a vertical switching device that includes the first patterned stack, while the second patterned stack functions as a horizontal interconnect structure. The vertical switching device can be a transistor or a gated diode.

42 Claims, 15 Drawing Sheets

(51) Int. Cl.
  *H01L 29/423* (2006.01)
  *H01L 29/08* (2006.01)
  *H01L 21/8234* (2006.01)
  *H01L 21/84* (2006.01)
  *H01L 29/739* (2006.01)
  *H01L 29/786* (2006.01)
  *H01L 27/12* (2006.01)

(52) U.S. Cl.
  CPC ...... *H01L 27/1203* (2013.01); *H01L 29/0847* (2013.01); *H01L 29/42356* (2013.01); *H01L 29/42384* (2013.01); *H01L 29/66666* (2013.01); *H01L 29/7391* (2013.01); *H01L 29/78642* (2013.01)

(58) Field of Classification Search
  USPC ........................................................ 257/329
  See application file for complete search history.

(56) References Cited

U.S. PATENT DOCUMENTS

| | | |
|---|---|---|
| 7,023,739 B2 | 4/2006 | Chen et al. |
| 7,129,538 B2 | 10/2006 | Lee et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,764,534 B2 | 7/2010 | Thorp et al. |
| 7,808,038 B2 | 10/2010 | Mokhlesi et al. |
| 7,825,455 B2 | 11/2010 | Lee et al. |
| 7,846,782 B2 | 12/2010 | Maxwell et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,932 B2 | 5/2012 | Nguyen et al. |
| 8,394,716 B2 | 3/2013 | Hwang et al. |
| 8,520,425 B2 | 8/2013 | Xiao et al. |
| 2002/0109176 A1 | 8/2002 | Forbes et al. |
| 2002/0109526 A1 | 8/2002 | Forbes et al. |
| 2003/0062574 A1 | 4/2003 | Hsieh |
| 2007/0210338 A1 | 9/2007 | Orlowski |
| 2007/0252201 A1 | 11/2007 | Kito et al. |
| 2009/0003082 A1 | 1/2009 | Meeks et al. |
| 2009/0230449 A1 | 9/2009 | Sakaguchi et al. |
| 2010/0013049 A1 | 1/2010 | Tanaka et al. |
| 2010/0044778 A1 | 2/2010 | Seol et al. |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0254191 A1 | 10/2010 | Son et al. |
| 2010/0320528 A1 | 12/2010 | Jeong et al. |
| 2011/0031546 A1 | 2/2011 | Uenaka et al. |
| 2011/0076819 A1 | 3/2011 | Kim et al. |
| 2011/0133606 A1 | 6/2011 | Yoshida et al. |
| 2011/0169071 A1 | 7/2011 | Uenaka |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0132986 A1 | 5/2012 | Kang et al. |
| 2012/0147644 A1* | 6/2012 | Scheuerlein ....... G11C 13/0002 365/51 |
| 2012/0147648 A1 | 6/2012 | Scheuerlein |
| 2012/0228579 A1* | 9/2012 | Bandyopadhyay ... H01L 29/165 257/5 |
| 2012/0228677 A1 | 9/2012 | Masuoka et al. |
| 2013/0026471 A1 | 1/2013 | Zahurak et al. |
| 2013/0264631 A1 | 10/2013 | Alsmeier et al. |
| 2013/0313627 A1 | 11/2013 | Lee |

FOREIGN PATENT DOCUMENTS

| | | |
|---|---|---|
| KR | 20110021444 A | 3/2011 |
| WO | WO02/15277 A2 | 2/2002 |

OTHER PUBLICATIONS

International Search Report & Written Opinion issued in PCT Application No. PCT/US15/62548, mailed Apr. 21, 2016 (17 pgs.).
U.S. Appl. No. 14/136,103, filed Dec. 20, 2013, Takaki.
U.S. Appl. No. 14/224,290, filed Mar. 25, 2014, Takaki.
U.S. Appl. No. 14/150,162, filed Jan. 8, 2014, Takaki et al.
U.S. Appl. No. 14/206,196, filed Mar. 12, 2014, Takaki.
Invitation to Pay Additional Search Fees issued in PCT Application No. PCT/US13/41410, mailed Sep. 9, 2013.(6 pp.).
International Search Report & Written Opinion, PCT/US2011/042566, Jan. 17, 2012 (30 pp.).
Invitation to Pay Additional Fees & Partial International Search Report, PCT/US2011/042566, Sep. 28, 2011. (7 pp.).
Endoh, T.et al., titled "Novel Ultra High Density Memory With a Stacked-Surrounding Gate Transistor (S-SGT) Structured Cell", IEDM Proc. (2001) 33-36.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Kimura, Masahide "3D Cells Make Terabit NAND Flash Possible," Nikkei Electronics Asia, Sep. 17, 2009, 6pgs.
Maeda et al., "Multi-Stacked 1G Cell/Layer Pipe-Shaped BiCS Flash Memory," 2009 Symposium on VLSI Technology Digest of Technical Papers, pp. 22-23.
Tanaka et al., "Bit-Cost Scalable Technology for Low-Cost and Ultrahigh-Density Flash Memory," Toshiba Review, vol. 63, No. 2, 2008, pp. 28-31.

* cited by examiner

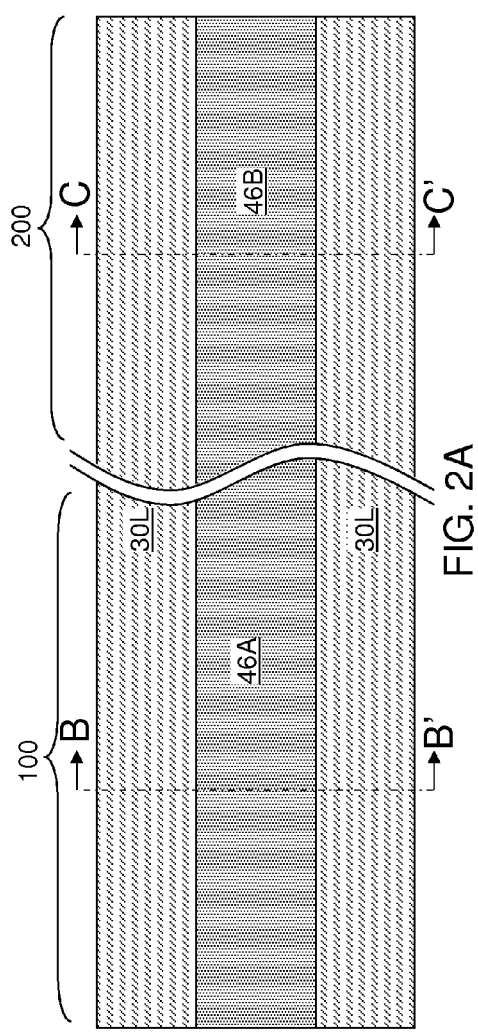
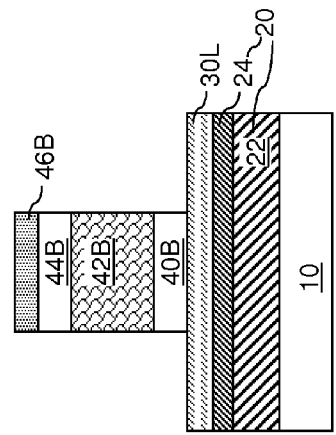
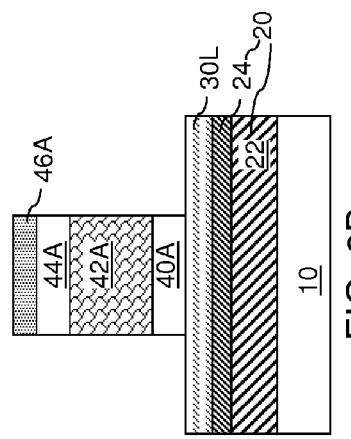

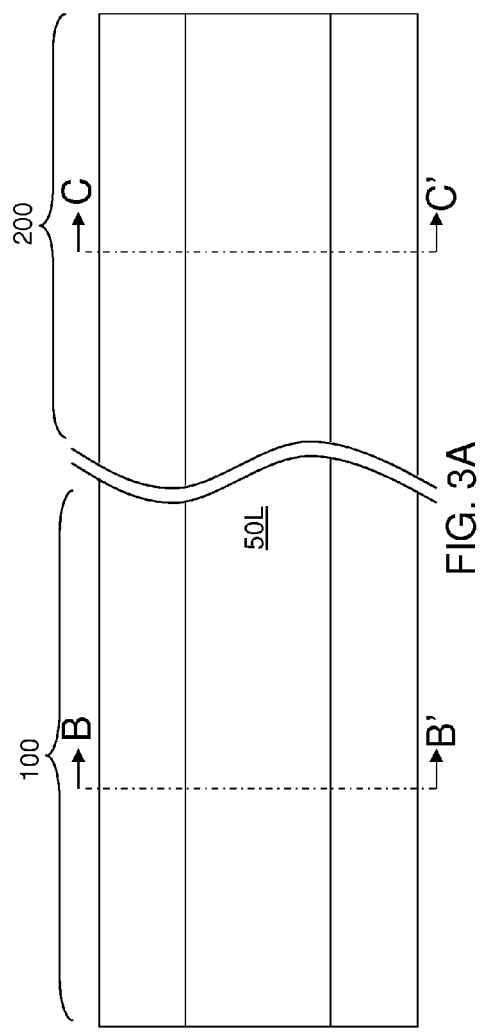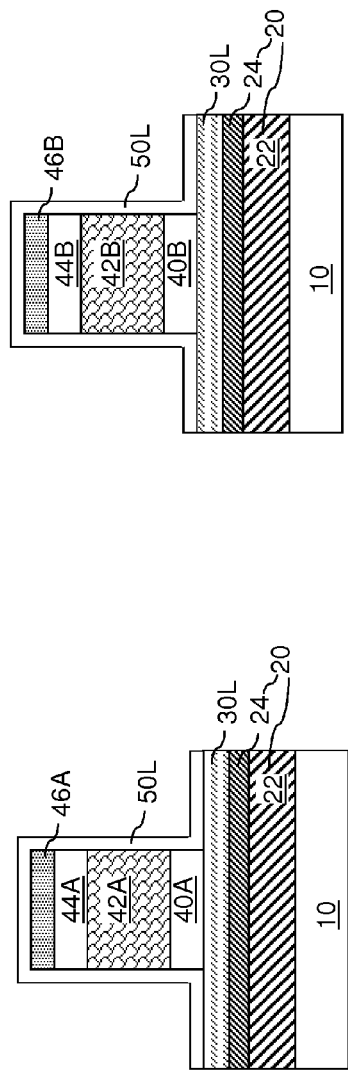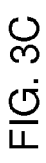

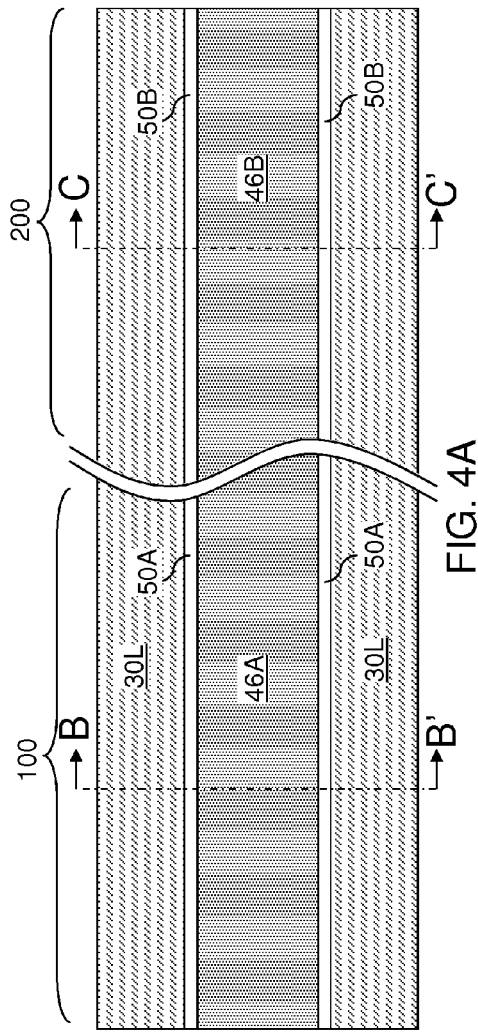
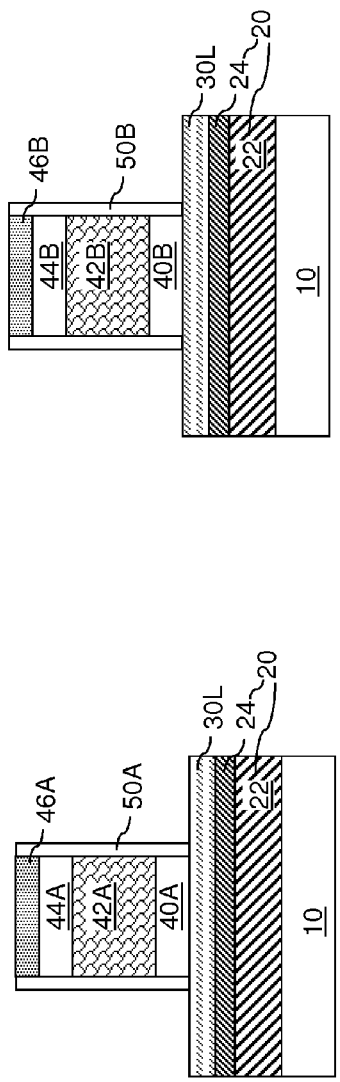
FIG. 4A
FIG. 4B
FIG. 4C

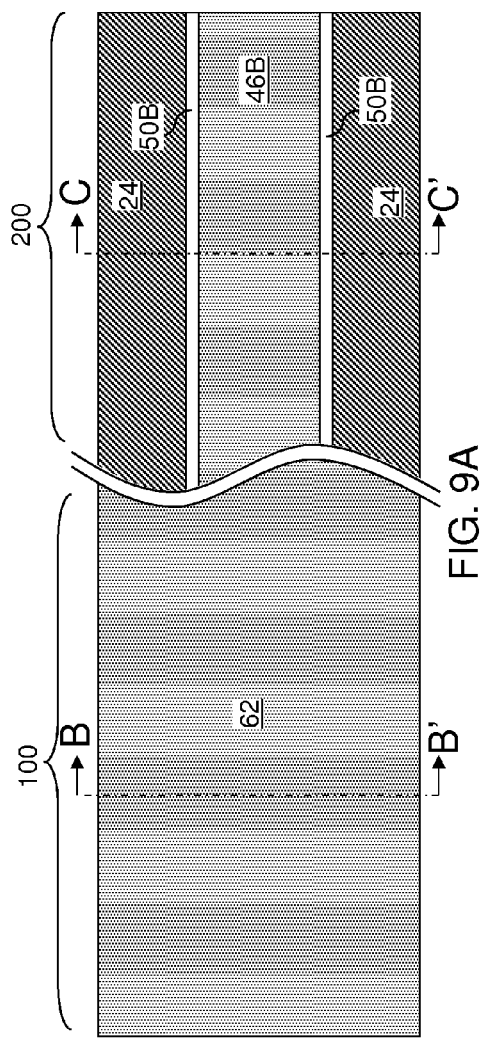
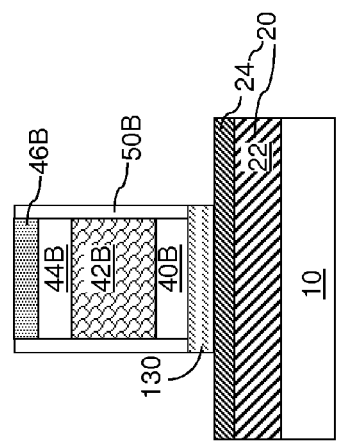
FIG. 9C
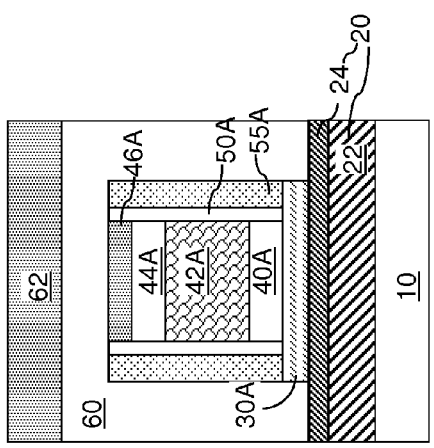
FIG. 9B
FIG. 9A

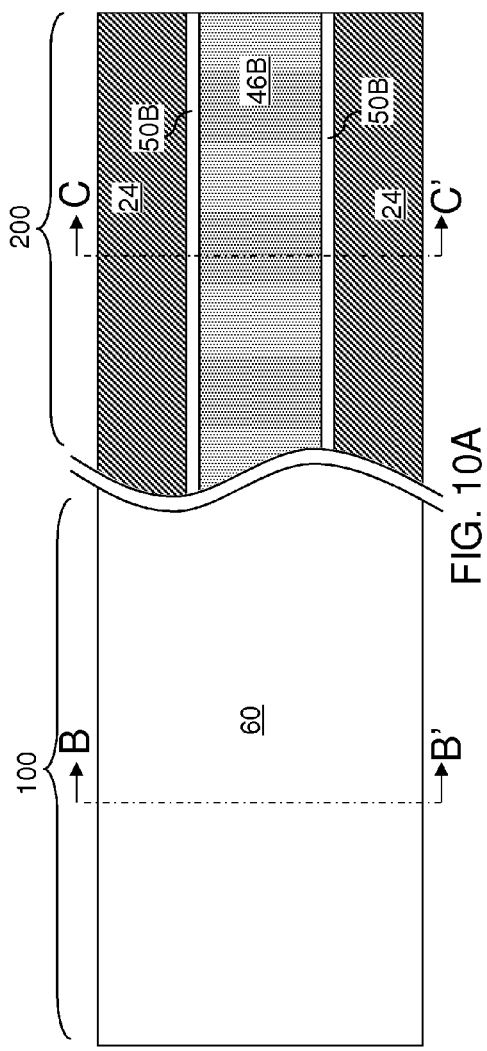
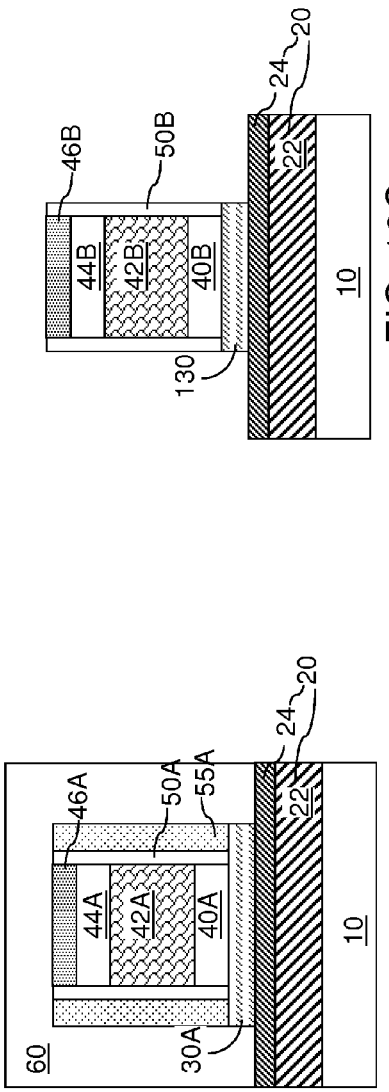
FIG. 10A
FIG. 10B
FIG. 10C

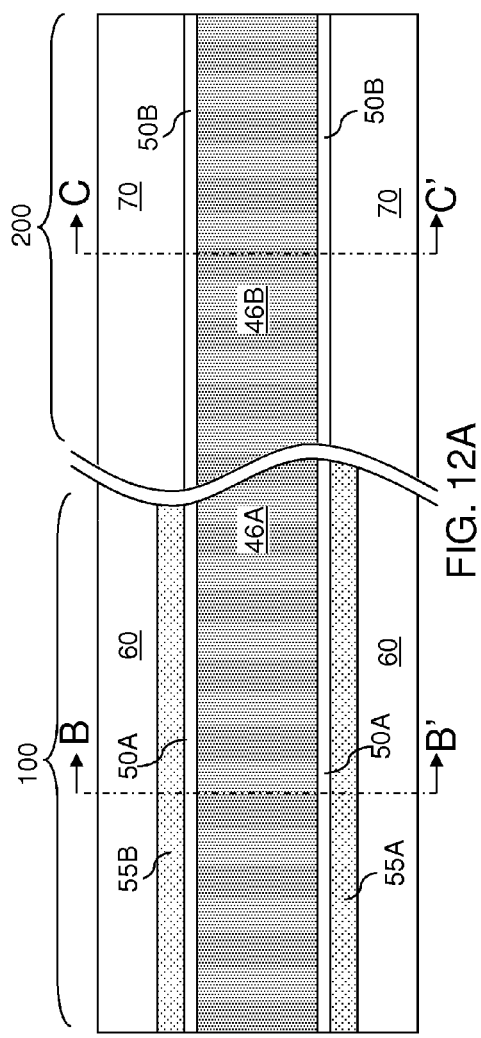
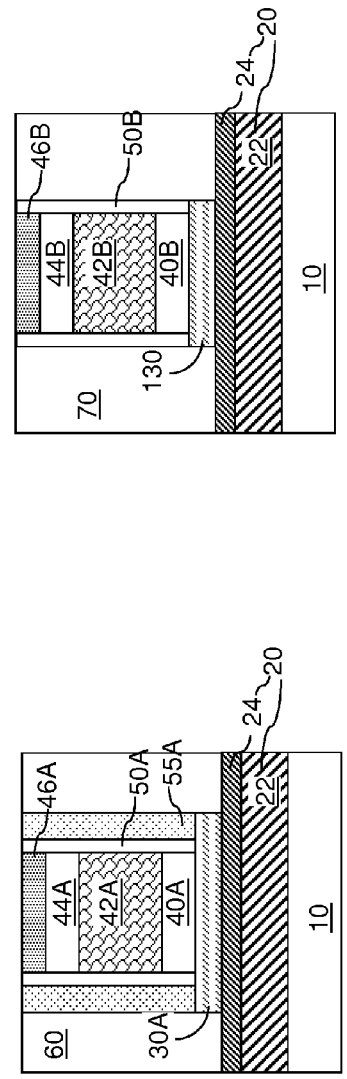
FIG. 12A
FIG. 12B
FIG. 12C

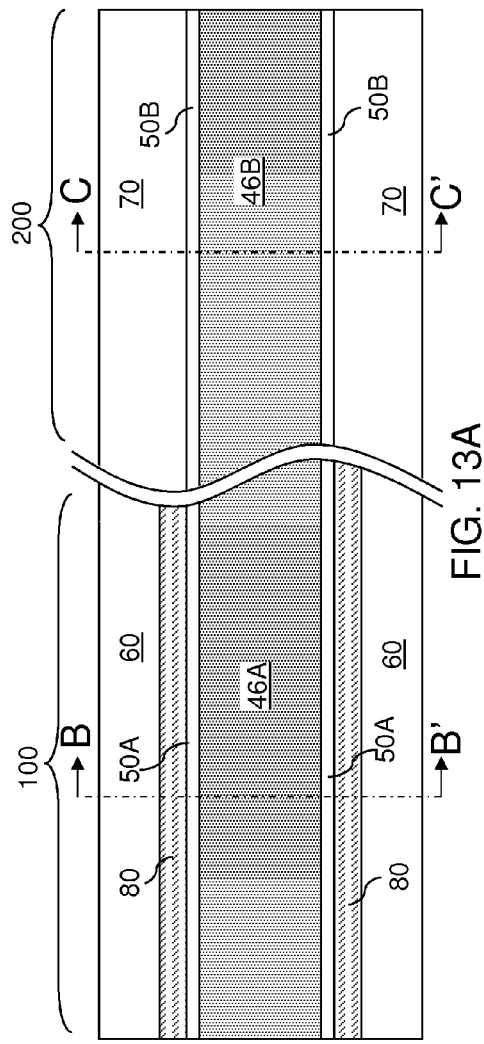
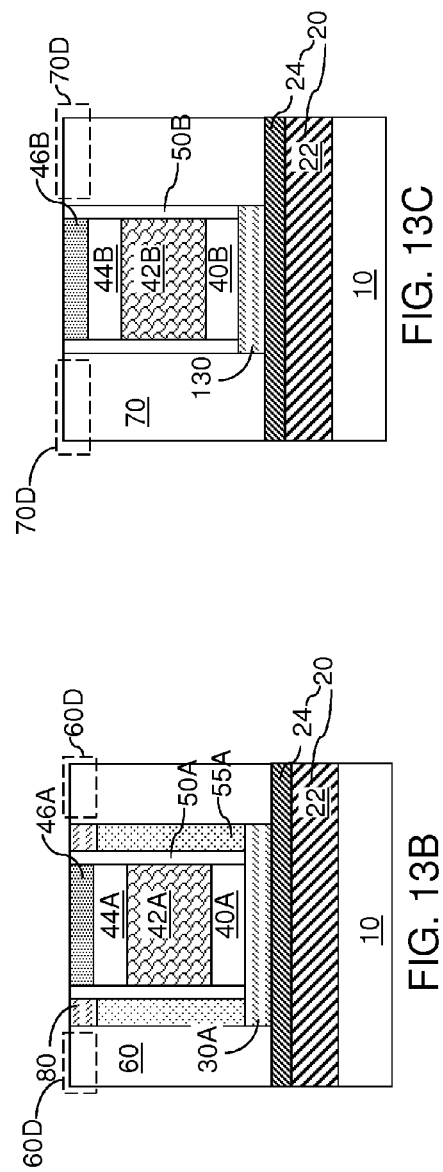
FIG. 13A
FIG. 13B
FIG. 13C

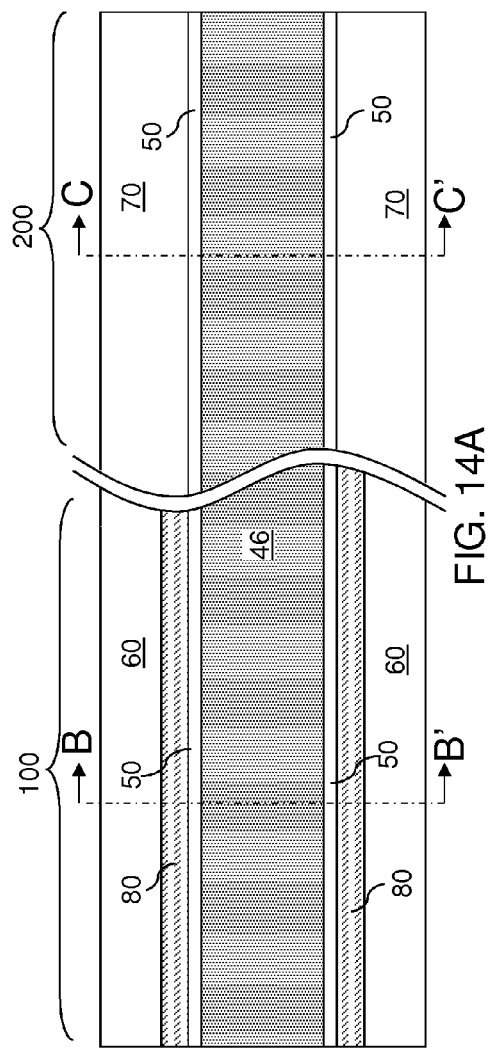
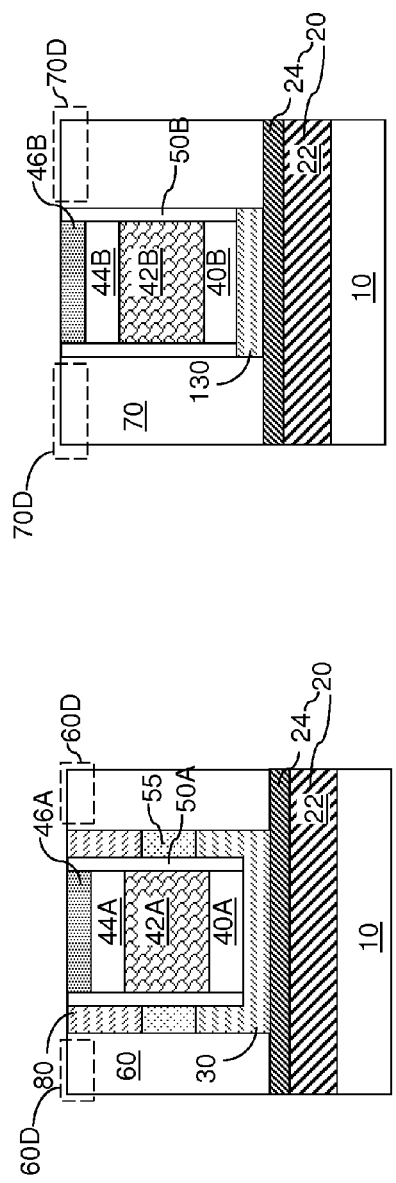
FIG. 14A
FIG. 14B
FIG. 14C

_US 9,583,615 B2_

VERTICAL TRANSISTOR AND LOCAL INTERCONNECT STRUCTURE

FIELD

The present disclosure relates generally to the field of semiconductor devices and specifically to semiconductor devices including a vertical transistor and a local interconnect structure and methods of making thereof.

BACKGROUND

Vertical field effect transistors can be employed for various purposes including accessing three-dimensional memory array devices such as resistive random access memory (ReRAM) devices and vertical NAND memory devices.

SUMMARY

According to an aspect of the present disclosure, a semiconductor structure is provided, which comprises a vertical switching device and a horizontal interconnect structure that are located on a substrate. The vertical switching device comprises: a gate electrode laterally contacted by a pair of gate dielectrics; a pair of semiconductor channels contacting a respective gate dielectric among the pair of gate dielectrics; a pair of top doped semiconductor regions adjoined to a respective top portion of the pair of semiconductor channels; and a bottom doped semiconductor region contacting lower portions of outer sidewalls of the pair of gate dielectrics, and adjoined to bottom portions of the pair of semiconductor channels. The horizontal interconnect structure comprises: a conductive material portion having a top surface that is coplanar with a top surface of the gate electrode, having a bottom surface that is coplanar with a bottom surface of the gate electrode, and comprising a same material as the gate electrode; a pair of dielectric material portions contacting sidewalls of the conductive material portion and having a same composition as the pair of gate dielectrics; and a dielectric material layer contacting outer sidewalls of the pair of dielectric material portions.

According to another aspect of the present disclosure, a semiconductor structure is provided, which comprises a gate electrode laterally contacted by a pair of gate dielectrics; a pair of semiconductor channels contacting a respective gate dielectric among the pair of gate dielectrics; a pair of top doped semiconductor regions adjoined to a respective top portion of the pair of semiconductor channels, a bottom doped semiconductor region contacting lower portions of outer sidewalls of the pair of gate dielectrics, and adjoined to bottom portions of the pair of semiconductor channels; and a metallic material layer contacting a bottom surface of the bottom doped semiconductor region and located on, or within, a substrate. Outer sidewalls of the pair of semiconductor channels, outer sidewalls of the pair of top doped semiconductor regions, and outer sidewalls of the bottom doped semiconductor region are located within a pair of vertical planes. The outer sidewalls of the bottom doped semiconductor region are adjoined to a top surface of the metallic material layer.

According to yet another aspect of the present disclosure, a semiconductor structure is provided, which comprises: a gate electrode laterally contacted by a pair of gate dielectrics; a pair of semiconductor channels contacting a respective gate dielectric among the pair of gate dielectrics; a bottom doped semiconductor region having a doping of a first conductivity type, contacting lower portions of outer sidewalls of the pair of gate dielectrics, and adjoined to bottom portions of the pair of semiconductor channels; and a pair of top doped semiconductor regions adjoined to a respective top portion of the pair of semiconductor channels and having a doping of a second conductivity type that is the opposite of the first conductivity type.

According to still another aspect of the present disclosure, a method of forming a semiconductor device is provided. A layer stack is formed over a substrate. The layer stack comprises, from bottom to top, a bottom semiconductor layer, a bottom dielectric spacer layer, a conductive material layer, and a top dielectric spacer layer. A first patterned stack and a second patterned stack are formed by patterning the layer stack. First gate dielectrics are formed on sidewalls of the first patterned stack, and second gate dielectrics are formed on sidewalls of the second patterned stack. First vertical semiconductor portions are formed on the first gate dielectrics, and second vertical semiconductor portions are formed on the second gate dielectrics. The second vertical semiconductor portions are formed while masking the first vertical semiconductor portions. A vertical switching device is formed by introducing electrical dopants to top regions of the first vertical semiconductor portions and to bottom regions of the first vertical semiconductor portions. A portion of the conductive material layer within the first patterned stack is a gate electrode that controls a state of the vertical switching device.

BRIEF DESCRIPTION OF THE DRAWINGS

FIG. 2A is a top-down view of an exemplary structure after formation of bottom dielectric spacers, conductive material portions, top dielectric spacers, and dielectric cap portions according to an embodiment of the present disclosure.

FIG. 2B is a vertical cross-sectional view of the exemplary structure of FIG. 2A along the vertical plane B-B'.

FIG. 2C is a vertical cross-sectional view of the exemplary structure of FIG. 2A along the vertical plane C-C'.

FIG. 3A is a top-down view of the exemplary structure after formation of a gate dielectric layer according to an embodiment of the present disclosure.

FIG. 3B is a vertical cross-sectional view of the exemplary structure of FIG. 3A along the vertical plane B-B'.

FIG. 3C is a vertical cross-sectional view of the exemplary structure of FIG. 3A along the vertical plane C-C'.

FIG. 4A is a top-down view of the exemplary structure after formation of gate dielectrics according to an embodiment of the present disclosure.

FIG. 4B is a vertical cross-sectional view of the exemplary structure of FIG. 4A along the vertical plane B-B'.

FIG. 4C is a vertical cross-sectional view of the exemplary structure of FIG. 4A along the vertical plane C-C'.

FIG. 9A is a top-down view of the exemplary structure after removal of second vertical semiconductor portions and peripheral regions of a second doped semiconductor portion, while first vertical semiconductor portions and a first doped semiconductor portion are masked by the patterned hard mask layer according to an embodiment of the present disclosure.

FIG. 9B is a vertical cross-sectional view of the exemplary structure of FIG. 9A along the vertical plane B-B'.

FIG. 9C is a vertical cross-sectional view of the exemplary structure of FIG. 9A along the vertical plane C-C'.

FIG. 10A is a top-down view of the exemplary structure after removal of the patterned hard mask layer according to an embodiment of the present disclosure.

FIG. 10B is a vertical cross-sectional view of the exemplary structure of FIG. 10A along the vertical plane B-B'.

FIG. 10C is a vertical cross-sectional view of the exemplary structure of FIG. 10A along the vertical plane C-C'.

FIG. 12A is a top-down view of the exemplary structure after planarization of the first and second dielectric material layers according to an embodiment of the present disclosure.

FIG. 12B is a vertical cross-sectional view of the exemplary structure of FIG. 12A along the vertical plane B-B'.

FIG. 12C is a vertical cross-sectional view of the exemplary structure of FIG. 12A along the vertical plane C-C'.

FIG. 13A is a top-down view of the exemplary structure after formation of top doped semiconductor regions according to an embodiment of the present disclosure.

FIG. 13B is a vertical cross-sectional view of the exemplary structure of FIG. 13A along the vertical plane B-B'.

FIG. 13C is a vertical cross-sectional view of the exemplary structure of FIG. 13A along the vertical plane C-C'.

FIG. 14A is a top-down view of the exemplary structure after an anneal process that diffuses electrical dopants from the first bottom semiconductor portion and the top doped semiconductor regions according to an embodiment of the present disclosure.

FIG. 14B is a vertical cross-sectional view of the exemplary structure of FIG. 14A along the vertical plane B-B'.

FIG. 14C is a vertical cross-sectional view of the exemplary structure of FIG. 14A along the vertical plane C-C'.

DETAILED DESCRIPTION

Embodiments of the present disclosure will be described below with reference to the accompanying drawings. It should be understood that the following description is intended to describe exemplary embodiments of the disclosure, and not to limit the disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Embodiments of the disclosure provide a monolithic, three dimensional array of memory devices, such as an array of ReRAM devices or vertical NAND strings. The memory cells of such devices may be vertically oriented, such that at least one memory cell is located over another memory cell. The array allows vertical scaling of the devices to provide a higher density of memory cells per unit area of silicon or other semiconductor material.

Figure 1A:
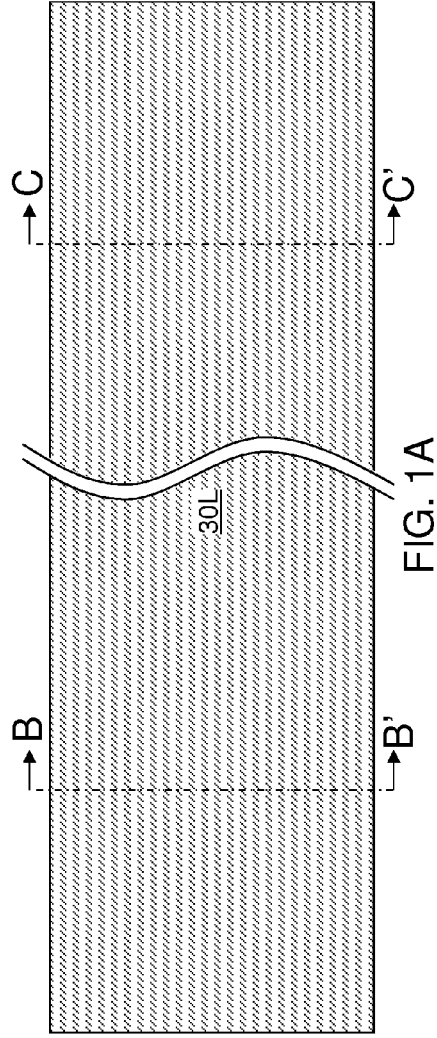
FIG. 1A is a top-down view of an exemplary structure after formation of a metallic material layer and a bottom semiconductor layer over a substrate according to an embodiment of the present disclosure.
Figure 1C:
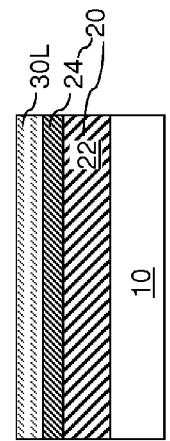
FIG. 1C is a vertical cross-sectional view of the exemplary structure of FIG. 1A along the vertical plane C-C'.
Figure 1B:
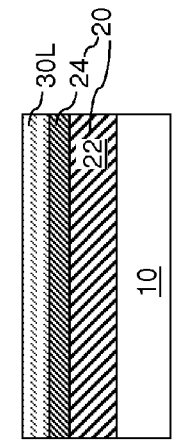
FIG. 1B is a vertical cross-sectional view of the exemplary structure of FIG. 1A along the vertical plane B-B'.

Referring to FIGS. 1A-1C, an exemplary structure according to an embodiment of the present disclosure includes a substrate 10, a metallic material layer 20 formed within, or on top of, the substrate 10, and a bottom semiconductor layer 30L formed on top of the metallic material layer 20. The substrate 10 can include an insulator material, a semiconductor material, and/or a conductive material. In one embodiment, a top portion of the substrate 10 in contact with a bottom surface of the metallic material layer 20 can comprise a dielectric material. In one embodiment, the substrate 10 can be a semiconductor substrate with an insulator layer (such as a silicon oxide layer) at a top portion thereof.

As used herein, a "semiconductor substrate" refers to a substrate that includes at least one semiconductor material portion, i.e., at least one portion of a semiconductor material. As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition.

The metallic material layer 20 comprises at least one metallic material. In one embodiment, the metallic material layer 20 can include a vertical stack of a metal layer 22 and a conductive barrier layer 24. The metal layer 22 includes an elemental metal or an intermetallic alloy of at least two elemental metals. In one embodiment, the metal layer 22 can comprise W, Cu, Al, Au, Ag, Pt, Ni, or a combination thereof. The metal layer 22 can have a thickness in a range from 10 nm to 100 nm, although lesser and greater thicknesses can also be employed. The metal layer 22 can be formed by chemical vapor deposition of physical vapor deposition.

The conductive barrier layer 24 comprises a material that prevents diffusion of the material of the metal layer 22 to the bottom semiconductor layer 30L. In one embodiment, the conductive barrier layer 24 can be an alloy of at least one metallic element and a non-metallic element such as nitrogen and/or carbon. For example, the conductive barrier layer 24 can comprise TiN, TaN, WN, TiC, TaC, WC, or a combination thereof. The thickness of the conductive barrier layer 24 can be in a range from 2 nm to 12 nm, although lesser and greater thicknesses can also be employed. The conductive barrier layer 24 can be formed, for example, by chemical vapor deposition or physical vapor deposition.

The bottom semiconductor layer 30L is a conductive material that comprises a heavily doped semiconductor material, e.g., a semiconductor material having electrical dopants at an atomic concentration greater than $1.0 \times 10^{19}$/cm$^3$. The conductivity type of the doped semiconductor material of the bottom semiconductor layer 30L is herein referred to as a first conductivity type, which can be p-type or n-type. The semiconductor material of the bottom semiconductor layer 30L can be an elemental semiconductor material (such as silicon) or an alloy of at least two elemental semiconductor materials (such as a silicon-germanium alloy), or can be a compound semiconductor material (such as a III-V compound semiconductor material or a II-VI compound semiconductor material), or can be an organic semiconductor material. The thickness of the bottom semiconductor layer 30L can be in a range from 10 nm to 100 nm, although lesser and greater thicknesses can also be employed.

Referring to FIGS. 2A-2C, a layer stack of a bottom dielectric spacer layer, a conductive material layer, a top dielectric spacer layer, and a dielectric cap layer are sequentially deposited over the bottom semiconductor layer 30L, and is subsequently patterned to form a first patterned stack (40A, 42A, 44A, 46A) in a first region (for example, in the region including the vertical cross-sectional plane B-B') and to form a second patterned stack (40B, 42B, 44B, 46B) in a second region (for example, in the region including the vertical cross-sectional plane C-C').

The bottom dielectric spacer layer includes a dielectric material such as silicon oxide, silicon nitride, a dielectric metal oxide. For example, the bottom dielectric spacer layer can comprise silicon oxide. The thickness of the bottom dielectric spacer layer can be in a range from 5 nm to 100 nm, although lesser and greater thicknesses can also be employed.

The conductive material layer comprises a conductive material, which can be a doped semiconductor material or a metallic material. For example, the conductive material layer can comprise heavily doped polysilicon. The thickness of the conductive material layer can be equal to, or greater than, the length of vertical semiconductor channels to be formed. The thickness of the conductive material layer can be, for example, in a range from 30 nm to 200 nm, although lesser and greater thicknesses can also be employed.

The top dielectric spacer layer includes a dielectric material such as silicon oxide, silicon nitride, a dielectric metal oxide. For example, the top dielectric spacer layer can comprise silicon oxide. The thickness of the top dielectric spacer layer can be in a range from 5 nm to 100 nm, although lesser and greater thicknesses can also be employed.

The dielectric cap layer includes a dielectric material that is different from the material of the top dielectric spacer layer. For example, if the top dielectric spacer layer comprises silicon oxide, the dielectric cap layer can comprise silicon nitride or a dielectric metal oxide, i.e., a dielectric oxide of at least one metallic element. The thickness of the dielectric cap layer can be in a range from 3 nm to 50 nm, although lesser and greater thicknesses can also be employed.

A photoresist layer can be applied over the layer stack of the bottom dielectric spacer layer, the conductive material layer, the top dielectric spacer layer, and the dielectric cap layer, and can be patterned into at least two portions each having a line shape. In one embodiment, the patterned portions of the photoresist layer can include a first line portion located in the region of the vertical plane B-B' and a second line portion located in the region of the vertical plane C-C'. The first line portion may, or may not, be contiguous with the second line portion.

The pattern in the photoresist layer is transferred through the layer stack of the bottom dielectric spacer layer, the conductive material layer, the top dielectric spacer layer, and the dielectric cap layer by an anisotropic etch, which can be at least one reactive ion etch. The first patterned stack (40A, 42A, 44A, 46A) is formed in a first region 100 underneath the first portion of the photoresist layer, and the second patterned stack (40B, 42B, 44B, 46B) is formed in a second region 200 underneath the second portion of the photoresist layer. The photoresist layer can be subsequently removed, for example, by ashing.

The first patterned stack (40A, 42A, 44A, 46A) includes, from bottom to top, a first bottom dielectric spacer 40A, a first conductive material portion 42A, a first top dielectric spacer 44A, and a first dielectric cap portion 46A. The second patterned stack (40B, 42B, 44B, 46B) includes, from bottom to top, a second bottom dielectric spacer 40B, a second conductive material portion 42B, a second top dielectric spacer 44B, and a second dielectric cap portion 46A. The first and second bottom dielectric spacers (40A, 40B) are remaining portions of the bottom dielectric spacer layer. The first and second conductive material portions (42A, 42B) are portions of the conductive material layer. The first and second top dielectric spacers (44A, 44B) are remaining portions of the top dielectric spacer layer. The first and second dielectric cap portions (46A, 46B) are remaining portions of the dielectric cap layer. The first patterned stack (40A, 42A, 44A, 46A) and the second patterned stack (40B, 42B, 44B, 46B) may, or may not, be contiguous with each other. In one embodiment, the first patterned stack (40A, 42A, 44A, 46A) and the second patterned stack (40B, 42B, 44B, 46B) can be different regions of a single contiguous stack that extends along a horizontal direction (which is herein referred to as the lengthwise direction). In another embodiment, the first patterned stack (40A, 42A, 44A, 46A) and the second patterned stack (40B, 42B, 44B, 46B) are two disjoined portions each horizontally extending along a respective lengthwise direction. The two lengthwise directions of the first patterned stack (40A, 42A, 44A, 46A) and the second patterned stack (40B, 42B, 44B, 46B) may be the same, or may be different.

Referring to FIGS. 3A-3C, a gate dielectric layer 50L can be formed on the sidewalls of the first patterned stack (40A, 42A, 44A, 46A) and the second patterned stack (40B, 42B, 44B, 46B) and over the bottom semiconductor layer 30L. The gate dielectric layer 50L can be a conformal dielectric material layer, i.e., a dielectric material layer having a same thickness throughout. The gate dielectric layer 50L can be formed by conformal deposition of a dielectric material and/or by conversion of surface portions of the first and second conductive material portions (42A, 42B) and the bottom semiconductor layer 30L. For example, the gate dielectric layer 50L can be formed by chemical vapor deposition of a dielectric material, atomic layer deposition of a dielectric material, thermal oxidation, thermal nitridation, plasma oxidation, and/or plasma nitridation. For example, the gate dielectric layer 50L can comprise silicon oxide, silicon nitride, silicon oxynitride, a dielectric metal oxide, or a combination thereof. The thickness of the gate dielectric layer 50L can be in a range from 1.2 nm to 6 nm, although lesser and greater thicknesses can also be employed.

Referring to FIGS. 4A-4C, an anisotropic etch can be performed to remove horizontal portions of the gate dielectric layer 50L. The anisotropic etch can be, for example, a reactive ion etch that is selective to the materials of the bottom semiconductor layer 30L and the first and second dielectric cap portions (46A, 46B). Remaining vertical portions of the gate dielectric layer 50L on the sidewalls of the first patterned stack (40A, 42A, 44A, 46A) in the first region 100 constitute first gate dielectrics 50A. Remaining vertical portions of the gate dielectric layer 50L on the sidewalls of the second patterned stack (40B, 42B, 44B, 46B) in the second region 200 constitute second gate dielectrics 50B. A pair of first gate dielectrics 50A can be formed on a parallel pair of sidewalls of the first patterned stack (40A, 42A, 44A, 46A), and a pair of second gate dielectrics 50B can be formed on a parallel pair of sidewalls of the second patterned stack (40B, 42B, 44B, 46B).

Figure 5A:
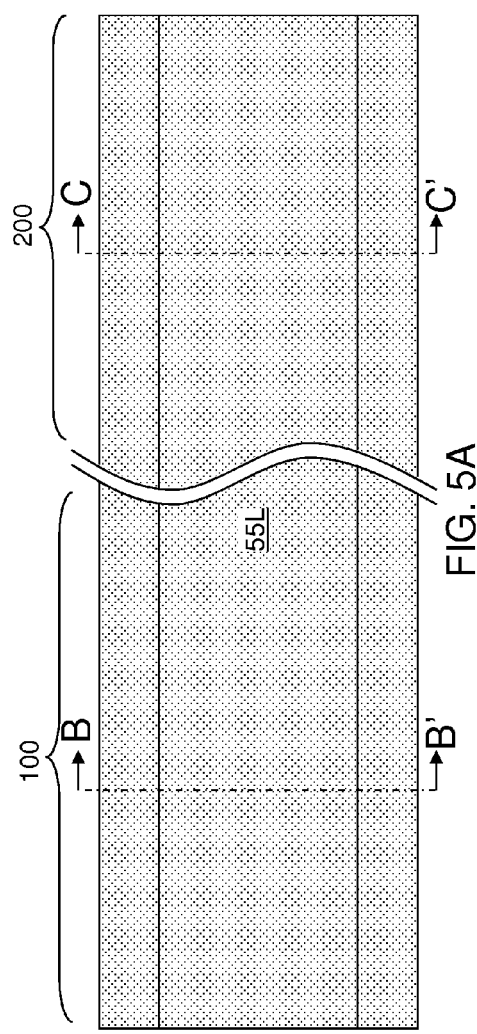
FIG. 5A is a top-down view of the exemplary structure after formation of a semiconductor material layer according to an embodiment of the present disclosure.
Figure 5C:
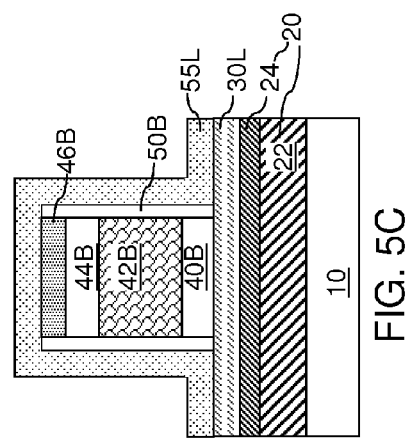
FIG. 5C is a vertical cross-sectional view of the exemplary structure of FIG. 5A along the vertical plane C-C'.
Figure 5B:
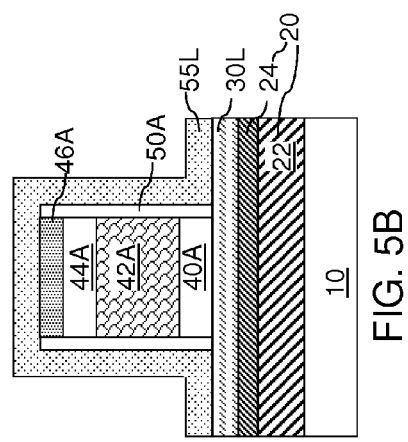
FIG. 5B is a vertical cross-sectional view of the exemplary structure of FIG. 5A along the vertical plane B-B'.

Referring to FIGS. 5A-5C, a semiconductor material layer 55L can be formed by deposition of a semiconductor material. The semiconductor material layer 55L can comprise at least one elemental semiconductor material, at least one compound semiconductor material, and/or at least one organic semiconductor material. In one embodiment, the semiconductor material layer 55L can include polysilicon, amorphous silicon, or a polycrystalline or amorphous semiconductor alloy including silicon and at least one of germanium and carbon. The semiconductor material layer 55L can be intrinsic, or can be doped with dopants of the first conductivity type, or can be doped with dopants of the second conductivity type that is the opposite of the first conductivity type. In case the semiconductor material layer 55L is not intrinsic, the dopant concentration of the semiconductor material layer 55L can be at a level that does not cause the semiconductor material layer 55L to become a conductive material. In one embodiment, the dopant concentration of the semiconductor material layer 55L can be in a range from $1.0 \times 10^{14}/cm^3$ to $1.0 \times 10^{17}/cm^3$, although lesser and greater dopant concentrations can also be employed.

The thickness of the semiconductor material layer 55L can be in a range from 3 nm to 100 nm, although lesser and greater thicknesses can also be employed. In one embodiment, the thickness of the semiconductor material layer 55L can be in a range from 6 nm to 30 nm. The semiconductor material layer 55L can be deposited by a conformal deposition method such as chemical vapor deposition or atomic layer deposition.

Figure 6A:
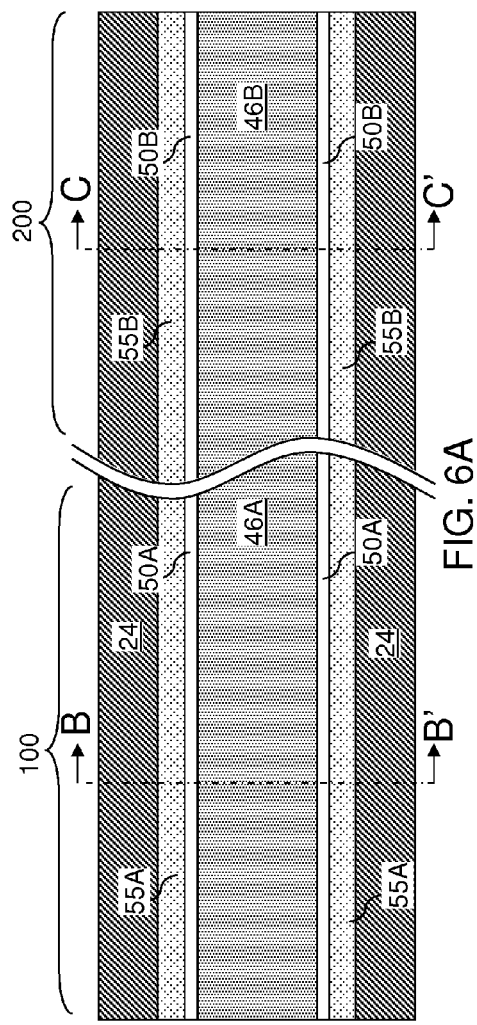
FIG. 6A is a top-down view of the exemplary structure after formation of vertical semiconductor portions according to an embodiment of the present disclosure.
Figure 6C:
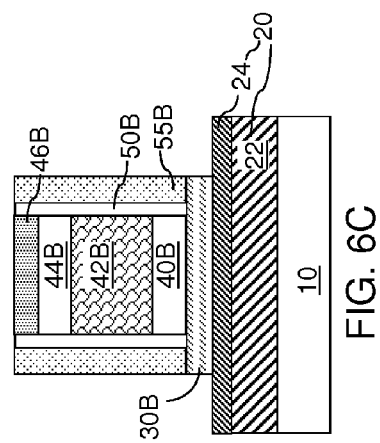
FIG. 6C is a vertical cross-sectional view of the exemplary structure of FIG. 6A along the vertical plane C-C'.
Figure 6B:
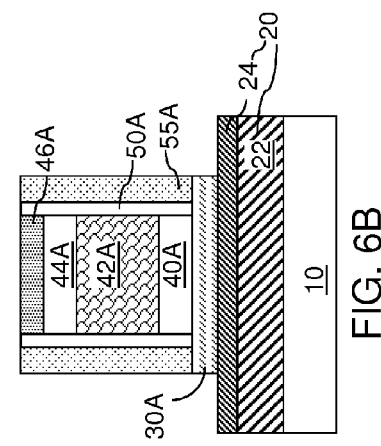
FIG. 6B is a vertical cross-sectional view of the exemplary structure of FIG. 6A along the vertical plane B-B'.

Referring to FIGS. 6A-6C, an anisotropic etch can be performed to remove horizontal portions of the semiconductor material layer 55L and portions of the bottom semiconductor layer 30L that are not covered by the first patterned stack (40A, 42A, 44A, 46A), the second patterned stack (40B, 42B, 44B, 46B), and vertical portions of the semiconductor material layer 55L. Each remaining vertical portion of the semiconductor material layer 55L constitutes vertical semiconductor portions (55A, 55B), which include first vertical semiconductor portions 55A located on the first gate dielectrics 50A and second vertical semiconductor portions 55B located on the second gate dielectrics 50B.

The first and second vertical semiconductor portions (55A, 55B) can be employed as an etch mask structure for etching the physically exposed portions of the bottom semiconductor layer 30L. The metal layer 22 can be employed as an etch stop layer for the etch process that removes the horizontal portions of the bottom semiconductor layer 30L. Topmost sub-portions of first and second dielectric cap portions (46A, 46B) and the first and second vertical semiconductor portions (55A, 55B) can be collaterally etched by the etch process during the etching of the horizontal portions of the bottom semiconductor layer 30L. The remaining portion of the bottom semiconductor layer 30L underlying the first patterned stack (40A, 42A, 44A, 46A), the first gate dielectrics 50A, and the first vertical semiconductor portions 55A is herein referred to as a first bottom semiconductor portion 30A. The remaining portion of the bottom semiconductor layer 30L underlying the second patterned stack (40B, 42B, 44B, 46B), the second gate dielectrics 50B, and the second vertical semiconductor portions 55B is herein referred to as a second bottom semiconductor portion 30B.

The first bottom semiconductor portion 30A is added to the pre-existing first patterned stack (40A, 42A, 44A, 46A) to form a modified first patterned stack (30A, 40A, 42A, 44A, 46A). The second bottom semiconductor portion 30B is added to the pre-existing second patterned stack (40B, 42B, 44B, 46B) to form a modified second patterned stack (30B, 40B, 42B, 44B, 46B). Thus, the first patterned stack (30A, 40A, 42A, 44A, 46A), as modified, comprises a first bottom semiconductor portion 30A, which is a patterned portion of the bottom semiconductor layer 30L. The second patterned stack (30B, 40B, 42B, 44B, 46B), as modified, comprises a second bottom semiconductor portion 30B, which is a patterned portion of the bottom semiconductor layer 30L.

The outer periphery of the first bottom semiconductor portion 30A can be vertically coincident with outer sidewalls of the first vertical semiconductor portions 55A. The outer periphery of the second bottom semiconductor portions 30B can be vertically coincident with outer sidewalls of the second vertical semiconductor portions 55B. As used herein, two surfaces are "vertically coincident" if there exists a vertical plane that contains both of the two surfaces.

Figure 7A:
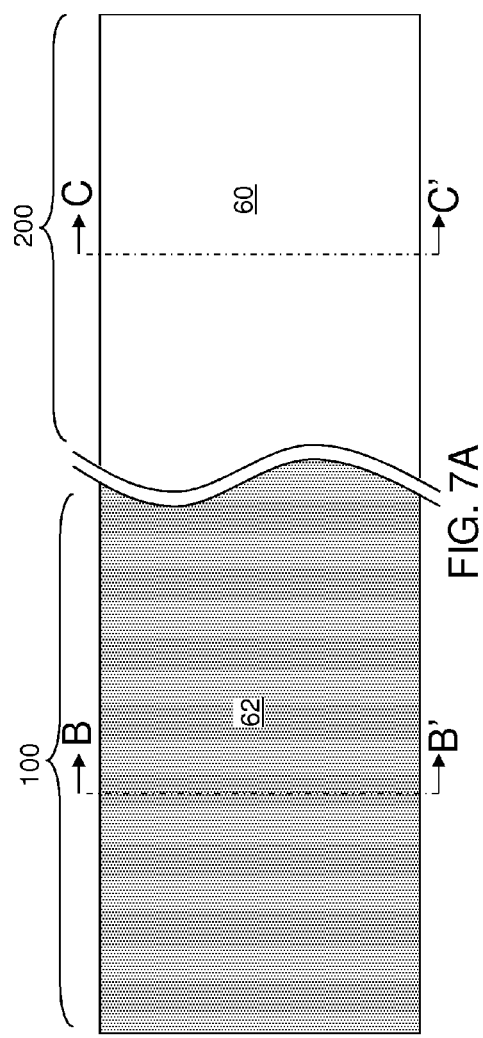
FIG. 7A is a top-down view of the exemplary structure after formation of a first dielectric material layer and a patterned hard mask layer according to an embodiment of the present disclosure.
Figure 7C:
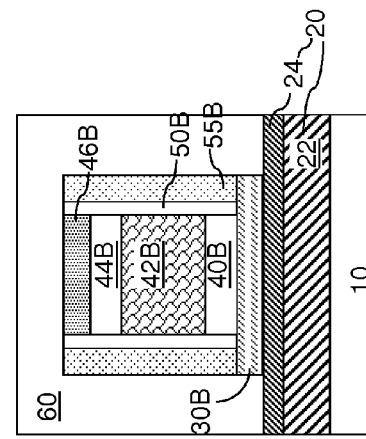
FIG. 7C is a vertical cross-sectional view of the exemplary structure of FIG. 7A along the vertical plane C-C'.
Figure 7B:
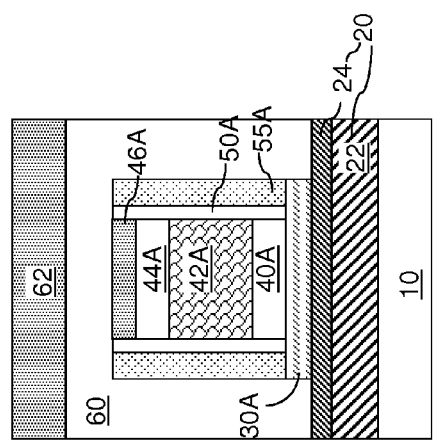
FIG. 7B is a vertical cross-sectional view of the exemplary structure of FIG. 7A along the vertical plane B-B'.

Referring to FIG. 7A-7C, a first dielectric material layer 60 is formed over the first patterned stack (30A, 40A, 42A, 44A, 46A) and the second patterned stack (30B, 40B, 42B, 44B, 46B). The first dielectric material layer 60 comprises a dielectric material such as silicon oxide, silicon nitride, organosilicate glass (OSG), and/or a spin-on glass. In one embodiment, the first dielectric material layer 60 can comprise a porous dielectric material layer such as porous organosilicate glass or a doped silicate glass (such as borosilicate glass or borophosphosilicate glass) that has a greater etch rate than undoped silicate glass. The thickness of the first dielectric material layer 60 is selected such that the bottommost portion of the first dielectric material layer 60 as deposited is located above the a horizontal plane including the top surfaces of the first and second dielectric cap portions (46A, 46B). In one embodiment, the first dielectric material layer 60 can be self-planarizing. In another embodiment, the first dielectric material layer 60 can be planarized, for example, by chemical mechanical planarization.

A hard mask layer 62 is formed over the first dielectric material layer 60, and is lithographically patterned so that a remaining portion of the hard mask layer 62 covers the first region 100, and the hard mask layer 62 is removed from the second region 200. The hard mask layer 62 comprises a material that is different from the material of the first dielectric material layer 60. The hard mask layer 62 can comprise a dielectric material, a metallic material, or a semiconductor material. In one embodiment, the hard mask layer 62 can comprise a dielectric material such as silicon nitride or a semiconductor material such as polysilicon.

Figure 8A:
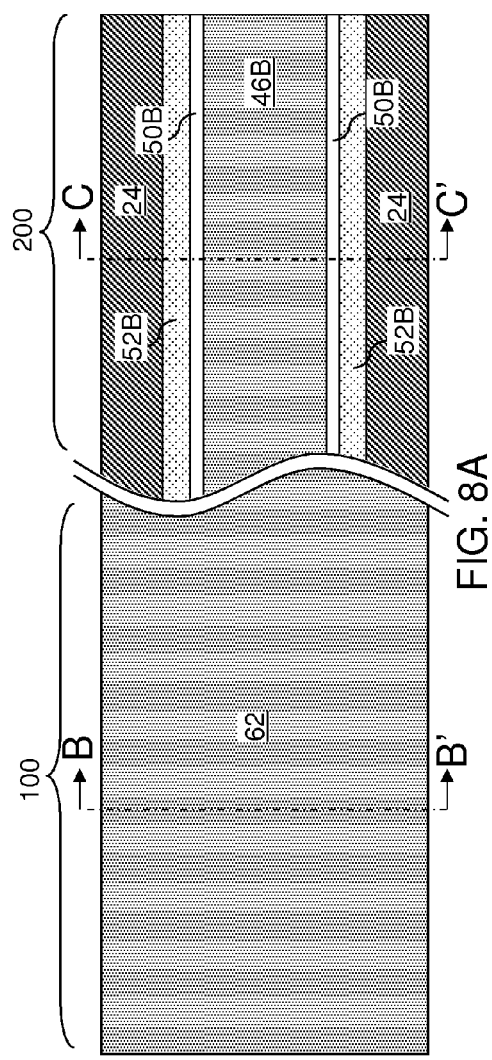
FIG. 8A is a top-down view of the exemplary structure after removal of a portion of the first dielectric material layer and a patterned hard mask layer according to an embodiment of the present disclosure.
Figure 8C:
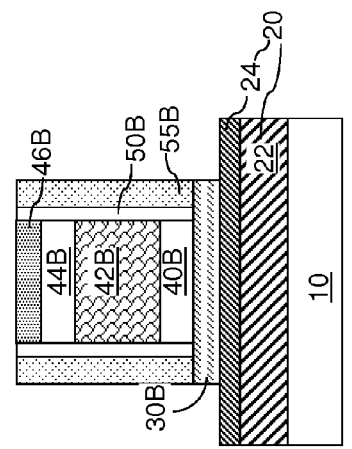
FIG. 8C is a vertical cross-sectional view of the exemplary structure of FIG. 8A along the vertical plane C-C'.
Figure 8B:
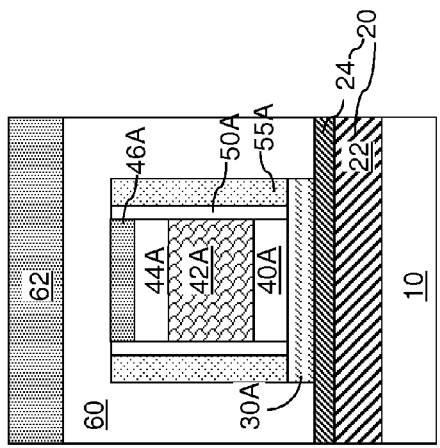
FIG. 8B is a vertical cross-sectional view of the exemplary structure of FIG. 8A along the vertical plane B-B'.

Referring to FIGS. 8A-8C, the dielectric material of the first dielectric material layer 60 can be removed selective to the materials of the second dielectric cap portion 46B and the metallic material layer 20. The hard mask layer 62 in the first region 100 can be employed as an etch mask layer during an etch process that removes the unmasked portions of the first dielectric material layer 60 in the second region 200. An isotropic etch process or an anisotropic etch process can be employed to remove the unmasked portion of the first dielectric material layer 60. In one embodiment, removal of the first dielectric material layer 60 can be performed while minimizing collateral etching of the second gate dielectrics 50B. For example, if a porous or non-porous organosilicate glass or a doped silicate glass is employed for the dielectric material of the first dielectric material layer 60, the first dielectric material layer 60 can be removed while minimizing collateral etching of the second gate dielectrics. The etch process that removes the dielectric material of the first dielectric material layer 60 may, or may not, be selective to the semiconductor material of the second vertical semiconductor portions 55B.

Referring to FIGS. 9A-9C, the semiconductor material of the second vertical semiconductor portions 55B and an underlying peripheral portion of the second bottom semiconductor portion 30B are removed in the second region 200 by an anisotropic etch that employs that combination of the second dielectric cap portion 46B and the hard mask layer 62 as an etch mask. Thus, the second vertical semiconductor portions 55B are removed while the first vertical semiconductor portions 55A in the first region 100 are masked by the hard mask layer 62.

In one embodiment, the anisotropic etch can be selective to the dielectric material of the second gate dielectrics 50B. The peripheral portions of the second bottom semiconductor portion 30B located outside the areas of the second gate dielectrics 50 are removed by the anisotropic etch. The remaining portion of the second bottom semiconductor portion 30B is herein referred to as a doped semiconductor portion 130. In one embodiment, outer sidewalls of the doped semiconductor portion 130 can be vertically coincident with outer sidewalls of the second gate dielectrics 50B. Alternatively, the dielectric material of the second gate dielectrics 50B can be removed during the anisotropic etch, or prior to the anisotropic etch. The peripheral portions of the second bottom semiconductor portion 30B located outside the area of the second dielectric cap portion 46B are removed by the anisotropic etch. The remaining portion of the second bottom semiconductor portion 30B constitutes the doped semiconductor portion 130. In this case, outer sidewalls of the doped semiconductor portion 130 can be vertically coincident with outer sidewalls of the stack of the second bottom dielectric spacer 40B, the second conductive material portion 42B, the second top dielectric spacer 44B, and the second dielectric cap portion 46A.

Referring to FIG. 10, the hard mask layer 62 can be removed after patterning of the second bottom semiconductor portion 30B to form the doped semiconductor portion 130. In this case, the removal of the hard mask layer 62 can be performed selective to the first dielectric material layer 60 and the second patterned stack (130, 40B, 42B, 44B, 46B) and optionally selective to the second gate dielectrics 50B. Alternatively, the hard mask layer 62 can be removed concurrently with removal of the second vertical semiconductor portions 50B or concurrently with patterning of the second bottom semiconductor portion 30B to form the doped semiconductor portion 130.

Figure 11A:
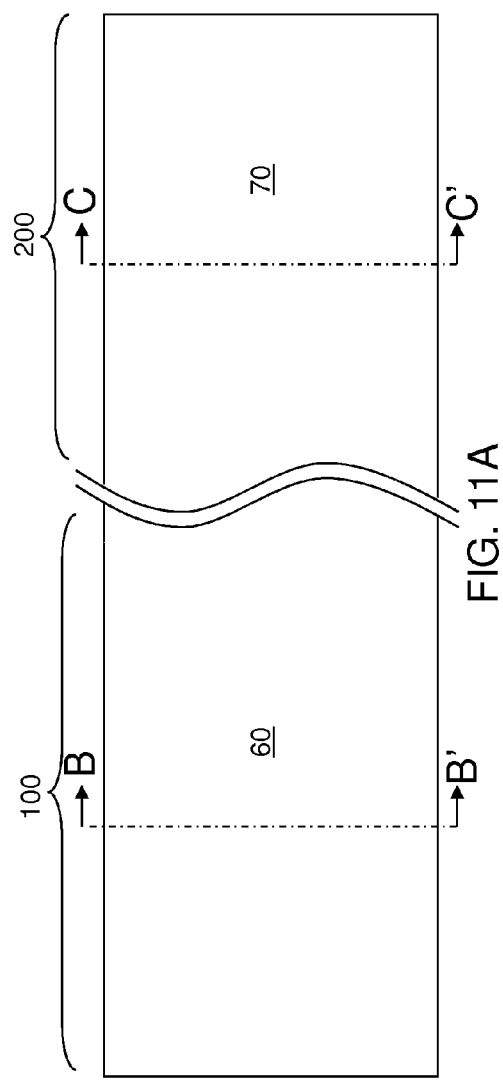
FIG. 11A is a top-down view of the exemplary structure after formation of a second dielectric material layer according to an embodiment of the present disclosure.
Figure 11C:
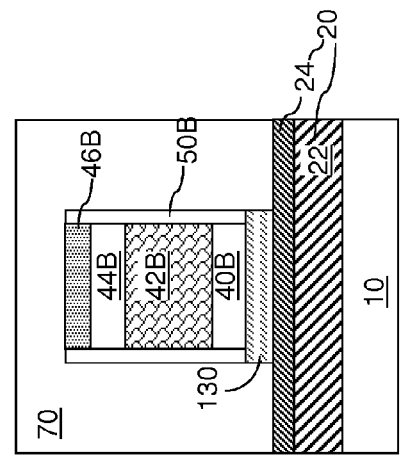
FIG. 11C is a vertical cross-sectional view of the exemplary structure of FIG. 11A along the vertical plane C-C'.
Figure 11B:
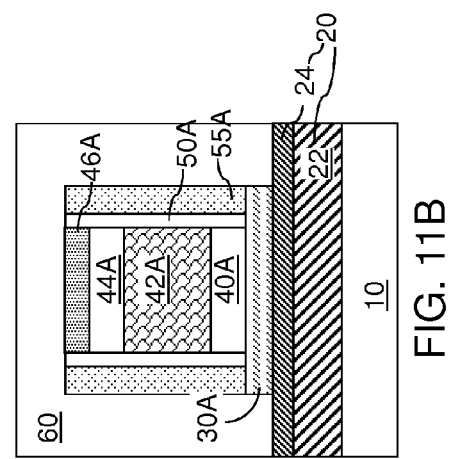
FIG. 11B is a vertical cross-sectional view of the exemplary structure of FIG. 11A along the vertical plane B-B'.

Referring to FIGS. 11A-11C, a second dielectric material layer 70 can be deposited over the second patterned stack (130, 40B, 42B, 44B, 46B) and the first dielectric material layer 60. The second dielectric material layer 70 may have the same composition as, or may have a composition different from, the composition of the first dielectric material layer 60. The dielectric material of the second dielectric material layer 70 can comprise, for example, silicon oxide, silicon nitride, silicon oxynitride, porous or non-porous organosilicate glass, or a spin-on glass. The dielectric material of the second dielectric material layer 70 can be planarized, for example, by a chemical mechanical planarization process, so that the top surface of the second dielectric material layer 70 is a planar surface. In one embodiment, the first dielectric material layer 60 can be employed as a stopping layer during the planarization process. In another embodiment, the first dielectric material layer 60 and the second dielectric material layer 70 can be simultaneously planarized during a planarization process. Alternatively, the second dielectric material layer 70 can be formed by a self-planarizing deposition process, and the top surface of the second dielectric material layer 70 can be formed above the top surface of the first dielectric material layer 60.

Referring to FIGS. 12A-12C, the first dielectric material layer 60 and the second dielectric material layer 70 are further planarized to remove portions located above a horizontal plane including the top surfaces of the first and second dielectric cap portions (46A, 46B). The first and second dielectric cap portions (46A, 46B) can be employed as stopping layers during the planarization of the first and second dielectric material layers (60, 70).

Referring to FIGS. 13A-13C, electrical dopants (i.e., p-type dopants or n-type dopants) are implanted into upper regions of the first vertical semiconductor portions to form top doped semiconductor regions 80. Introduction of the electrical dopants into the top regions of the first vertical semiconductor portions can be performed, for example, by ion implantation and/or by plasma doping.

In one embodiment, the conductivity type of the top doped semiconductor regions 80 may be the first conductivity type, i.e., the same conductivity type as the conductivity type of the first bottom semiconductor portion 30A. In this case, the first vertical semiconductor portions 55A can be intrinsic, or can have a second conductivity type that is the opposite of the first conductivity type.

In another embodiment, the conductivity type of the top doped semiconductor regions 80 may be a second conductivity type that is the opposite of the first conductivity type. Thus, a p-n junction diode or a p-i-n junction diode can be formed by the vertical stack of the first bottom semiconductor portion 30B, the first vertical semiconductor portions 55A, and the top doped semiconductor regions 80. In case a p-n junction diode is formed, the first vertical semiconductor portions 55A are doped, and the p-n junction may be formed at the interface between the first bottom semiconductor portion 30B and the first vertical semiconductor portions 55A, or can be formed at the interface between the first vertical semiconductor portions 55A and the top doped semiconductor regions 80. For each case, the first bottom semiconductor portion 30B can have a p-type doping or an n-type doping. In case a p-i-n diode is formed, the first vertical semiconductor portions 55A are intrinsic, and the first bottom semiconductor portion 30B can have a p-type doping or an n-type doping.

Topmost regions of the first dielectric layer 60 and the second dielectric layer 70 can be collaterally doped with electrical dopants during the implantation of the electrical dopants to form the top doped semiconductor regions 80. For example, first doped dielectric material portions 60D having a higher concentration of electrical dopants than unimplanted portions of the first dielectric layer 60 can be formed in the implanted regions of the first dielectric layer 60, and second doped dielectric material portions 70D having a higher concentration of electrical dopants than unimplanted portions of the second dielectric layer 70 can be formed in the implanted regions of the second dielectric layer 70.

Referring to FIGS. 14A-14C, an anneal can be performed at an elevated temperature to diffuse the electrical dopants in the first bottom semiconductor portion 30A and in the top doped semiconductor regions 80. The anneal process diffuses out the electrical dopants from the first bottom semiconductor portion 30A and top doped semiconductor regions 80. The region into which the electrical dopants of the first bottom semiconductor portion 30A expand is herein referred to as a bottom doped semiconductor region 30. The subportions of the first vertical semiconductor portions 55A that are not substantially affected in dopant concentration are herein referred to as semiconductor channels 55, which can be a semiconductor channel of a field effect transistor, an intrinsic semiconductor portion of a p-i-n diode, or a p-doped region or an n-doped region of a p-n diode.

The temperature and duration of the anneal process can be selected such that the interface between the bottom doped semiconductor region 30 and the semiconductor channels 55 is located at, or above, the horizontal plane including the interface between the first lower dielectric spacer 40A and the first conductive material portion 42A. Further, the temperature and duration of the anneal process can be selected such that the interface between the top doped semiconductor regions 80 and the semiconductor channels 55 is located at, or below, the horizontal plane including the interface between the first upper dielectric spacer 44A and the first conductive material portion 42A.

Thus, a vertical switching device can be formed by introducing electrical dopants to top regions of the first vertical semiconductor portions 55A and to bottom regions of the first vertical semiconductor portions 55A. A portion of the conductive material layer within the first patterned stack, i.e., the first conductive material portion 42A, is a gate electrode that controls the state of the vertical switching device, e.g., by selecting the state from among a conducive state (i.e., an "on state") and a non-conductive state (i.e., an "off state"). The bottom regions of first vertical semiconductor portions 55A are doped with dopants that diffuse out from a portion of the bottom semiconductor layer, i.e., from the first bottom semiconductor portion 30A, into the bottom regions of the first vertical semiconductor portion 55A.

In one embodiment, the vertical switching device is a field effect transistor, and the top regions of the first vertical semiconductor portions 55A and the bottom regions of the first vertical semiconductor portions are source and drain regions, which are doped with electrical dopants of a same conductivity type, which can be the first conductivity type of the bottom doped semiconductor region 30 and the top doped semiconductor regions 80. The channels 55 can be intrinsic, or can have a doping of the opposite conductivity type, i.e., the second conductivity type. The first conductive material portion 42A can function as the gate electrode of the field effect transistor.

In another embodiment, the vertical switching device is a gated diode, and the top regions of the first vertical semiconductor portions 55A and the bottom regions of the first vertical semiconductor portions 55A are doped with electrical dopants of opposite conductivity types. Thus, the bottom doped semiconductor region 30 and the top doped semiconductor regions 80 are doped with dopants of the opposite conductivity types. In this case, the channels 55 can have the same conductivity type as the first bottom semiconductor portion 30A, or can have the same conductivity type as the top doped semiconductor regions 80. The first conductive material portion 42A can function as the gate electrode of the gated diode.

The second conductive material portion 42B located in the second region 200 can be employed as a component of a local interconnect structure. The second conductive material portion 42B may be electrically shorted to the first conductive material portion 42A to function as a local interconnect structure for gate electrodes, or may be electrically isolated from the first conductive material portion 42A.

In one embodiment, the exemplary structure includes a semiconductor structure, which comprises a vertical switching device and a horizontal interconnect structure that are located on a substrate 10. The vertical switching device comprises: a gate electrode 42A laterally contacted by a pair of gate dielectrics 50A; a pair of semiconductor channels 55 contacting a respective gate dielectric 50A among the pair of gate dielectrics; a pair of top doped semiconductor regions 80 adjoined to a respective top portion of the pair of semiconductor channels 55; and a bottom doped semiconductor region 30 contacting lower portions of outer sidewalls of the pair of gate dielectrics 55A, and adjoined to bottom portions of the pair of semiconductor channels 55. The horizontal interconnect structure can comprise a conductive material portion, i.e., the second conductive material portion 42B, having a horizontal top surface that is coplanar with (i.e., located within a two-dimensional Euclidean plane as) a horizontal top surface of the gate electrode 42A, having a horizontal bottom surface that is coplanar with a horizontal bottom surface of the gate electrode 42A, and comprising a same material as the gate electrode 42A. The horizontal interconnect structure can further comprise a pair of dielectric material portions, i.e., the second gate dielectrics 50B, contacting sidewalls of the conductive material portion 42B and having a same composition as the pair of gate dielectrics 50A; and a dielectric material layer, e.g., the second dielectric material layer 70, contacting outer sidewalls of the pair of dielectric material portions 50B.

In one embodiment, the exemplary structure includes a semiconductor structure, which comprises a gate electrode 42A laterally contacted by a pair of gate dielectrics 50A; a pair of semiconductor channels 55 contacting a respective gate dielectric 55A among the pair of gate dielectrics; a pair of top doped semiconductor regions 80 adjoined to a respective top portion of the pair of semiconductor channels 55; a bottom doped semiconductor region 30 contacting lower portions of outer sidewalls of the pair of gate dielectrics 50A, and adjoined to bottom portions of the pair of semiconductor channels 55; and a metallic material layer 20 contacting a bottom surface of the bottom doped semiconductor region 30 and located on, or within, a substrate 10. Outer sidewalls of the pair of semiconductor channels 55, outer sidewalls of the pair of top doped semiconductor regions 80, and outer sidewalls of the bottom doped semiconductor region 30 are located within a pair of vertical planes. The outer sidewalls of the bottom doped semiconductor region 30 are adjoined to a top surface of the metallic material layer.

In one embodiment, the exemplary structure includes a semiconductor structure, which comprises a gate electrode 42A laterally contacted by a pair of gate dielectrics 50A; a pair of semiconductor channels 55 contacting a respective gate dielectric 50A among the pair of gate dielectrics; a bottom doped semiconductor region 30 having a doping of a first conductivity type, contacting lower portions of outer sidewalls of the pair of gate dielectrics, and adjoined to bottom portions of the pair of semiconductor channels; and a pair of top doped semiconductor regions 80 adjoined to a respective top portion of the pair of semiconductor channels 55 and having a doping of a second conductivity type that is the opposite of the first conductivity type.

In one embodiment, a doped semiconductor portion 130 can have a same width as a lateral distance between outer sidewalls of the pair of dielectric material portions 50B and comprising a same semiconductor material as the bottom doped semiconductor region 30. The doped semiconductor portion 130 contacts the second dielectric material layer 70. The semiconductor structure further comprises a bottom dielectric spacer 40A layer contacting a bottom surface of the gate electrode 42A and lower portions of inner sidewalls of the pair of gate dielectrics 50A; and a top dielectric spacer 44A contacting a top surface of the gate electrode 42A and portions of the inner sidewalls of the pair of gate dielectrics 50A. A bottom surface of the bottom dielectric spacer 40A can contact a top surface of the bottom doped semiconductor region 30, sidewalls of the bottom dielectric spacer 40A can contact the pair of gate dielectrics 50A, and sidewalls of the top dielectric spacer 44A can contact the pair of gate dielectrics 50A.

A first dielectric cap portion 46A can be provided, which comprises a dielectric material, contacts a top surface of the top dielectric spacer 44A, and contacts upper portions of the pair of gate dielectrics 50A. A second dielectric cap portion 46B can be provided, which comprises the dielectric material of the first dielectric cap portion 46A, overlies the conductive material portion 42B, and has a top surface that is coplanar with the top surface of the first dielectric cap portion 46A and a top surface of the second dielectric material layer 70. The first dielectric material layer 60 contacts outer sidewalls of the pair of semiconductor channels 55, outer sidewalls of the pair of top doped semiconductor regions 80, and outer sidewalls of the bottom doped semiconductor region 30. The first dielectric material layer 60 can have a top surface that is coplanar with top surfaces of the pair of top doped semiconductor regions 80.

In one embodiment, the pair of top doped semiconductor regions 80 and the bottom doped semiconductor region 30 are doped with electrical dopants of a same conductivity type. In another embodiment, the pair of top doped semiconductor regions 80 and the bottom doped semiconductor region 30 are doped with electrical dopants of opposite conductivity types. In one embodiment, the pair of semiconductor channels 55 comprises an intrinsic semiconductor material.

In one embodiment, the first dielectric material layer 60 contacts outer sidewalls of the pair of semiconductor channels 55, and outer sidewalls of the bottom doped semiconductor region 80. The metallic material layer 20 contacts a bottom surface of the first dielectric material layer 60. The metallic material layer 20 contacts a bottom surface of the bottom doped semiconductor region 30 and located on, or within, a substrate 10.

Figure 15:
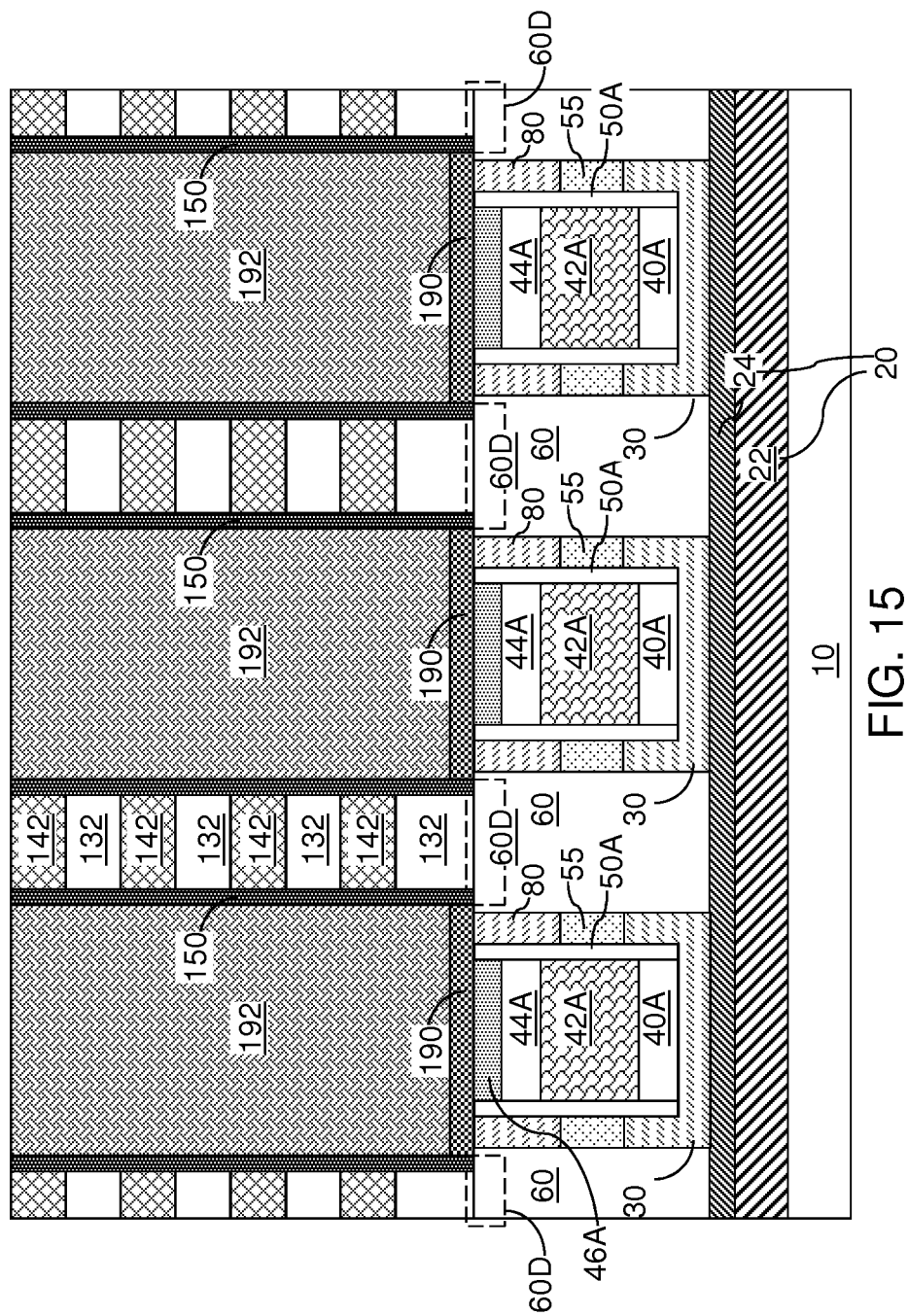
FIG. 15 is a top-down view of the exemplary structure after formation of a three-dimensional array of memory cells according to an embodiment of the present disclosure.

Referring to FIG. 15, a three-dimensional array of memory devices can be optionally formed over an array of vertical switching devices of the present disclosure. Each vertical switching device can be an access transistor for an electrical node, such as a vertical bit line, of a memory device within the array.

In one embodiment, the three-dimensional array of memory devices can comprise a resistive random access memory including a stack of alternating layers including electrically insulating layers 132 and electrically conductive layers 142 (which can be, for example, word lines). Vertical line trenches can be formed in regions overlying the access transistors such that top surfaces of respective top doped semiconductor regions 80 are physically exposed at the bottom of each vertical line trench. After formation of memory material spacers 150 by a conformal deposition of a memory material and anisotropic etch, a conductive line structure (190, 192) (which can be, for example, bit lines) can be formed within each vertical line trench. Each conductive line structure (190, 192) can comprise a conductive liner 190 and a conductive fill portion 192. The conductive liner 190 can comprise a conductive metallic nitride such as TiN, TaN, and/or WN. The conductive fill portion 192 can comprise at least one elemental metal such as W, Cu, Ti, and Ru. The memory material spacers 150 can comprise any non-volatile memory material that changes resistance through a hysteresis effect as known in the art, including, but not limited to, a metal oxide (such as nickel oxide) and chalcogenide materials.

Alternatively, the three-dimensional memory devices can comprise a vertical NAND device located in a device region. In this case, memory stack structures can be formed in lieu of memory material spacers and conductive line structures (190, 192). The electrically conductive layers 142 can comprise, or can be electrically connected to, a respective word line of the vertical NAND device. In one embodiment, the device region containing the three-dimensional memory devices can comprise: a plurality of semiconductor channels, wherein at least one end portion of each of the plurality of semiconductor channels extends substantially perpendicular to a top surface of the substrate 10; a plurality of charge storage regions, each charge storage region located adjacent to a respective one of the plurality of semiconductor channels; and a plurality of control gate electrodes (as embodied as the electrically conductive layers 142) having a strip shape extending substantially parallel to the top surface of the substrate 10. The plurality of control gate electrodes can comprise at least a first control gate electrode located in a first device level and a second control gate electrode located in a second device level. The electrically conductive layers 142 in the stack can be in electrical contact with the plurality of control gate electrode and extend from the device region to a contact region including the plurality of electrically conductive via connections. The substrate 10 can comprise a silicon substrate containing a driver circuit for the NAND device.

The vertical switching device illustrated in FIGS. 14A-14C may comprise a bottom select transistor of a vertical NAND string or parts of the driver circuit thereof. The bottom doped semiconductor region 30 of each vertical switching device are separated from one another by the first dielectric material layer 60, while the metallic material layer 20 can function as a global bit line which contiguously extends among different vertical switching devices and electrically shorts multiple bottom doped semiconductor region 30 of the vertical switching devices to one another.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a vertical switching device and a horizontal interconnect structure that are located on a substrate, wherein:
   the vertical switching device comprises:
      a gate electrode laterally contacted by a pair of gate dielectrics;
      a pair of semiconductor channels contacting a respective gate dielectric among the pair of gate dielectrics;
      a pair of top doped semiconductor regions adjoined to a respective top portion of the pair of semiconductor channels; and
      a bottom doped semiconductor region contacting lower portions of outer sidewalls of the pair of gate dielectrics, and adjoined to bottom portions of the pair of semiconductor channels, and the horizontal interconnect structure comprises a conductive material portion having a top surface that is coplanar with a top surface of the gate electrode, having a bottom surface that is coplanar with a bottom surface of the gate electrode, and comprising a same material as the gate electrode,
   wherein the horizontal interconnect structure further comprises:
      a pair of dielectric material portions contacting sidewalls of the conductive material portion and having a same composition as the pair of gate dielectrics; and
      a dielectric material layer contacting outer sidewalls of the pair of dielectric material portions.

2. The semiconductor structure of claim 1, wherein outer sidewalls of the pair of semiconductor channels, outer sidewalls of the pair of top doped semiconductor regions, and outer sidewalls of the bottom doped semiconductor region are located within a pair of vertical planes.

3. The semiconductor structure of claim 1, wherein outer sidewalls of the bottom doped semiconductor region are adjoined to a top surface of a metallic material layer located on, or within, a substrate.

4. The semiconductor structure of claim 1, further comprising:
   a bottom dielectric spacer contacting a bottom surface of the gate electrode and lower portions of inner sidewalls of the pair of gate dielectrics; and
   a top dielectric spacer contacting a top surface of the gate electrode and portions of the inner sidewalls of the pair of gate dielectrics.

5. The semiconductor structure of claim 1, further comprising a doped semiconductor portion underlying the conductive material portion, having a same width as a lateral distance between outer sidewalls of the pair of dielectric material portions, and comprising a same semiconductor material as the bottom doped semiconductor region, wherein the doped semiconductor portion contacts the dielectric material layer.

6. The semiconductor structure of claim 1, wherein:
   a bottom surface of the bottom dielectric spacer contacts a top surface of the bottom doped semiconductor region;
   sidewalls of the bottom dielectric spacer contacts the pair of gate dielectrics; and
   sidewalls of the top dielectric spacer contact the pair of gate dielectrics.

7. The semiconductor structure of claim 6, further comprising:
   a first dielectric cap portion comprising a dielectric material, contacting a top surface of the top dielectric spacer, and contacting upper portions of the pair of gate dielectrics; and
   a second dielectric cap portion comprising the dielectric material of the first dielectric cap portion, overlying the conductive material portion, and having a top surface that is coplanar with a top surface of the first dielectric cap portion and a top surface of the dielectric material layer.

8. The semiconductor structure of claim 1, further comprising another dielectric material layer that contacts outer sidewalls of the pair of semiconductor channels, outer sidewalls of the pair of top doped semiconductor regions, and outer sidewalls of the bottom doped semiconductor region.

9. The semiconductor structure of claim 1, further comprising an array of memory devices overlying the vertical switching device, wherein the vertical switching device is an access transistor for an electrical node of a memory device within the array.

10. The semiconductor structure of claim 1, wherein the pair of top doped semiconductor regions and the bottom doped semiconductor region are doped with electrical dopants of a same conductivity type.

11. The semiconductor structure of claim 1, wherein the pair of top doped semiconductor regions and the bottom doped semiconductor region are doped with electrical dopants of opposite conductivity types.

12. A semiconductor structure comprising:
   a gate electrode laterally contacted by a pair of gate dielectrics;
   a pair of semiconductor channels contacting a respective gate dielectric among the pair of gate dielectrics;

a pair of top doped semiconductor regions adjoined to a respective top portion of the pair of semiconductor channels;
a bottom doped semiconductor region contacting lower portions of outer sidewalls of the pair of gate dielectrics, and adjoined to bottom portions of the pair of semiconductor channels; and
a metallic material layer contacting a bottom surface of the bottom doped semiconductor region and located on, or within, a substrate, wherein:
outer sidewalls of the pair of semiconductor channels, outer sidewalls of the pair of top doped semiconductor regions, and outer sidewalls of the bottom doped semiconductor region are located within a pair of vertical planes;
the outer sidewalls of the bottom doped semiconductor region are adjoined to a top surface of the metallic material layer;
a first dielectric material layer comprising a dielectric material, contacting outer sidewalls of the pair of top doped semiconductor material portions, and having a top surface that is coplanar with top surfaces of the pair of top doped semiconductor regions; and
at least one element selected from a first element, a second element, and a third element: wherein:
the first element is a horizontal interconnect structure that comprises:
a conductive material portion having a top surface that is coplanar with a top surface of the gate electrode, having a bottom surface that is coplanar with a bottom surface of the gate electrode, and comprising a same material as the gate electrode,
a pair of dielectric material portions contacting sidewalls of the conductive material portion and having a same composition as the pair of gate dielectrics, and
a second dielectric material layer contacting outer sidewalls of the pair of dielectric material portions;
the second element is a doped semiconductor portion having a same width as a lateral distance between outer sidewalls of the pair of dielectric material portions and comprising a same semiconductor material as the bottom doped semiconductor region, wherein the first dielectric material layer contacts outer sidewalls of the pair of semiconductor channels, and outer sidewalls of the bottom doped semiconductor region; and
the third element is another bottom doped semiconductor region located on the metallic material layer and disjoined from the bottom doped semiconductor region.

13. The semiconductor structure of claim 12, further comprising:
a bottom dielectric spacer contacting a bottom surface of the gate electrode and lower portions of inner sidewalls of the pair of gate dielectrics; and
a top dielectric spacer contacting a top surface of the gate electrode and portions of the inner sidewalls of the pair of gate dielectrics;
wherein:
a bottom surface of the bottom dielectric spacer contacts a top surface of the bottom doped semiconductor region;
sidewalls of the bottom dielectric spacer contacts the pair of gate dielectrics; and
sidewalls of the top dielectric spacer contact the pair of gate dielectrics.

14. The semiconductor structure of claim 12, wherein semiconductor structure comprises the first element.

15. The semiconductor structure of claim 14, further comprising a dielectric cap portion overlying the conductive material portion and having a top surface that is coplanar with a top surface of the second dielectric material layer.

16. The semiconductor structure of claim 12, wherein the semiconductor structure comprises the second element.

17. The semiconductor structure of claim 12, wherein the metallic material layer contacts a bottom surface of a first dielectric material layer.

18. The semiconductor structure of claim 12, further comprising an array of memory devices overlying the pair of top doped semiconductor regions, wherein the pair of top doped semiconductor regions is electrically shorted to an electrical node of a memory device within the array.

19. The semiconductor structure of claim 12, wherein the semiconductor structure comprises the third element.

20. The semiconductor structure of claim 12, wherein the pair of top doped semiconductor regions and the bottom doped semiconductor region are doped with electrical dopants of a same conductivity type.

21. The semiconductor structure of claim 12, wherein the pair of top doped semiconductor regions and the bottom doped semiconductor region are doped with electrical dopants of opposite conductivity types.

22. A semiconductor structure comprising:
a gate electrode laterally contacted by a pair of gate dielectrics;
a pair of semiconductor channels contacting a respective gate dielectric among the pair of gate dielectrics;
a bottom doped semiconductor region having a doping of a first conductivity type, contacting lower portions of outer sidewalls of the pair of gate dielectrics, and adjoined to bottom portions of the pair of semiconductor channels;
a pair of top doped semiconductor regions adjoined to a respective top portion of the pair of semiconductor channels and having a doping of a second conductivity type that is the opposite of the first conductivity type;
a first dielectric material layer comprising a dielectric material and have a top surface that is coplanar with top surfaces of the pair of top doped semiconductor regions; and
at least one element selected from a first element and a second element, wherein:
the first element is a horizontal interconnect structure that comprises:
a conductive material portion having a top surface that is coplanar with a top surface of the gate electrode, having a bottom surface that is coplanar with a bottom surface of the gate electrode, and comprising a same material as the gate electrode,
a pair of dielectric material portions contacting sidewalls of the conductive material portion and having a same composition as the pair of gate dielectrics, and
a second dielectric material layer contacting outer sidewalls of the pair of dielectric material portions; and
the second element is a doped semiconductor portion having a same width as a lateral distance between outer sidewalls of the pair of dielectric material portions and comprising a same semiconductor material as the bottom doped semiconductor region.

23. The semiconductor structure of claim 22, wherein the pair of semiconductor channels comprises an intrinsic semiconductor material.

24. The semiconductor structure of claim 22, further comprising:
a bottom dielectric spacer contacting a bottom surface of the gate electrode and lower portions of inner sidewalls of the pair of gate dielectrics; and
a top dielectric spacer contacting a top surface of the gate electrode and portions of the inner sidewalls of the pair of gate dielectrics.

25. The semiconductor structure of claim 24, wherein:
a bottom surface of the bottom dielectric spacer contacts a top surface of the bottom doped semiconductor region;
sidewalls of the bottom dielectric spacer contacts the pair of gate dielectrics; and
sidewalls of the top dielectric spacer contact the pair of gate dielectrics.

26. The semiconductor structure of claim 22, wherein the semiconductor structure comprises the first element.

27. The semiconductor structure of claim 26, further comprising a dielectric cap portion overlying the conductive material portion and having a top surface that is coplanar with a top surface of the first dielectric material layer.

28. The semiconductor structure of claim 22, wherein the semiconductor structure comprises the second element.

29. The semiconductor structure of claim 22, wherein the first dielectric material layer contacts outer sidewalls of the pair of semiconductor channels, outer sidewalls of the pair of top doped semiconductor regions, and outer sidewalls of the bottom doped semiconductor region.

30. The semiconductor structure of claim 22, further comprising an array of memory devices overlying the pair of top doped semiconductor regions, wherein the pair of top doped semiconductor regions is electrically shorted to an electrical node of a memory device within the array.

31. The semiconductor structure of claim 22, further comprising a metallic material layer contacting a bottom surface of the bottom doped semiconductor region and located on, or within, a substrate.

32. The semiconductor structure of claim 31, wherein:
outer sidewalls of the pair of semiconductor channels, outer sidewalls of the pair of top doped semiconductor regions, and outer sidewalls of the bottom doped semiconductor region are located within a pair of vertical planes; and
the outer sidewalls of the bottom doped semiconductor region are adjoined to a top surface of the metallic material layer.

33. A semiconductor structure comprising:
a gate electrode laterally contacted by a pair of gate dielectrics;
a pair of semiconductor channels contacting a respective gate dielectric among the pair of gate dielectrics;
a bottom doped semiconductor region having a doping of a first conductivity type, contacting lower portions of outer sidewalls of the pair of gate dielectrics, and adjoined to bottom portions of the pair of semiconductor channels;
a pair of top doped semiconductor regions adjoined to a respective top portion of the pair of semiconductor channels and having a doping of a second conductivity type that is the opposite of the first conductivity type; and
a first dielectric material layer comprising a dielectric material and have a top surface that is coplanar with top surfaces of the pair of top doped semiconductor regions, wherein the first dielectric material layer contacts outer sidewalls of the pair of semiconductor channels, outer sidewalls of the pair of top doped semiconductor regions, and outer sidewalls of the bottom doped semiconductor region.

34. The semiconductor structure of claim 33, wherein the pair of semiconductor channels comprises an intrinsic semiconductor material.

35. The semiconductor structure of claim 33, further comprising:
a bottom dielectric spacer contacting a bottom surface of the gate electrode and lower portions of inner sidewalls of the pair of gate dielectrics; and
a top dielectric spacer contacting a top surface of the gate electrode and portions of the inner sidewalls of the pair of gate dielectrics.

36. The semiconductor structure of claim 35, wherein:
a bottom surface of the bottom dielectric spacer contacts a top surface of the bottom doped semiconductor region;
sidewalls of the bottom dielectric spacer contacts the pair of gate dielectrics; and
sidewalls of the top dielectric spacer contact the pair of gate dielectrics.

37. The semiconductor structure of claim 33, further comprising a horizontal interconnect structure that comprises:
a conductive material portion having a top surface that is coplanar with a top surface of the gate electrode, having a bottom surface that is coplanar with a bottom surface of the gate electrode, and comprising a same material as the gate electrode;
a pair of dielectric material portions contacting sidewalls of the conductive material portion and having a same composition as the pair of gate dielectrics; and
a second dielectric material layer contacting outer sidewalls of the pair of dielectric material portions.

38. The semiconductor structure of claim 37, further comprising a dielectric cap portion overlying the conductive material portion and having a top surface that is coplanar with a top surface of the first dielectric material layer.

39. The semiconductor structure of claim 33, further comprising a doped semiconductor portion having a same width as a lateral distance between outer sidewalls of the pair of dielectric material portions and comprising a same semiconductor material as the bottom doped semiconductor region.

40. The semiconductor structure of claim 33, further comprising an array of memory devices overlying the pair of top doped semiconductor regions, wherein the pair of top doped semiconductor regions is electrically shorted to an electrical node of a memory device within the array.

41. The semiconductor structure of claim 33, further comprising a metallic material layer contacting a bottom surface of the bottom doped semiconductor region and located on, or within, a substrate.

42. The semiconductor structure of claim 41, wherein:
outer sidewalls of the pair of semiconductor channels, outer sidewalls of the pair of top doped semiconductor regions, and outer sidewalls of the bottom doped semiconductor region are located within a pair of vertical planes; and
the outer sidewalls of the bottom doped semiconductor region are adjoined to a top surface of the metallic material layer.

* * * * *